United States Patent
Menezo et al.

(10) Patent No.: US 10,483,716 B2
(45) Date of Patent: Nov. 19, 2019

(54) PHOTONIC DEVICE COMPRISING A LASER OPTICALLY CONNECTED TO A SILICON WAVE GUIDE AND METHOD OF FABRICATING SUCH A PHOTONIC DEVICE

(71) Applicant: Commissariat à l'énergie atomique et aux énergies alternatives, Paris (FR)

(72) Inventors: Sylvie Menezo, Voiron (FR); Torrey Lane Thiessen, Toronto (CA); Joyce Kai See Poon, Toronto (CA)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/873,465

(22) Filed: Jan. 17, 2018

(65) Prior Publication Data

US 2018/0212399 A1 Jul. 26, 2018

(30) Foreign Application Priority Data

Jan. 19, 2017 (FR) ...................................... 17 50441

(51) Int. Cl.
*H01S 5/026* (2006.01)
*H01S 5/10* (2006.01)
(Continued)

(52) U.S. Cl.
CPC .............. *H01S 5/026* (2013.01); *H01S 5/021* (2013.01); *H01S 5/0218* (2013.01);
(Continued)

(58) Field of Classification Search
CPC ........ H01S 5/026; H01S 5/0218; H01S 5/021; H01S 5/12–125; H01S 5/1032;
(Continued)

(56) References Cited

U.S. PATENT DOCUMENTS

| 6,795,622 B2 * | 9/2004 | Forrest | ................... B82Y 20/00 |
| | | | 372/6 |
| 7,482,184 B2 | 1/2009 | Fedeli | |

(Continued)

FOREIGN PATENT DOCUMENTS

| EP | 2544319 A1 * | 1/2013 | ........... H01S 5/1032 |
| EP | 2988378 A1 | 2/2016 | |
| FR | 3020188 A1 * | 10/2015 | ............. H01S 5/026 |

OTHER PUBLICATIONS

Search Report for French application No. 1750441 dated Nov. 16, 2017.

(Continued)

*Primary Examiner* — Joshua King
(74) *Attorney, Agent, or Firm* — Pearne & Gordon LLP

(57) ABSTRACT

A photonic device comprising: a support; an intermediate layer comprising at least one dielectric material and a first and second excess thickness of silicon separated from each other by a space; a first patterned silicon layer at least partially forming a waveguide, and first to fifth waveguide sections; a first dielectric layer covering the first silicon layer and a gain structure comprising at least one gain medium in contact with the first dielectric layer; the second and fourth wave guide sections, the first and second excess thicknesses of silicon, and the first and second ends of the gain structure forming a first and second optical transition zone between a hybrid laser waveguide, formed by a central portion of the gain structure, the space and the third waveguide section and the first and fifth waveguide sections respectively. The invention also relates to a method of fabricating such a photonic device.

18 Claims, 16 Drawing Sheets

(51) Int. Cl.
*H01S 5/125* (2006.01)
*H01S 5/042* (2006.01)
*H01S 5/02* (2006.01)
*H01S 5/12* (2006.01)
*H01S 5/30* (2006.01)

(52) U.S. Cl.
CPC ............ *H01S 5/1032* (2013.01); *H01S 5/125* (2013.01); *H01S 5/0215* (2013.01); *H01S 5/0265* (2013.01); *H01S 5/0424* (2013.01); *H01S 5/124* (2013.01); *H01S 5/3013* (2013.01); *H01S 2301/163* (2013.01); *H01S 2301/176* (2013.01)

(58) Field of Classification Search
CPC ............ H01S 5/1014; G02B 6/12002; G02B 6/12004; G02B 2006/12061; G02B 2006/12097; G02B 2006/121; G02B 2006/12107; G02B 2006/12121
See application file for complete search history.

(56) References Cited

U.S. PATENT DOCUMENTS

| | | | |
|---|---|---|---|
| 8,761,220 | B2 | 6/2014 | Ben Bakir |
| 9,405,066 | B2* | 8/2016 | Mahgerefteh ............ G02B 6/124 |
| 9,461,441 | B2 | 10/2016 | Chantre |
| 9,509,122 | B1* | 11/2016 | Norberg ................. H01S 5/3211 |
| 9,742,150 | B1* | 8/2017 | Hofrichter ............. H01S 5/1014 |
| 10,132,998 | B2* | 11/2018 | Hassan .................... G02B 6/131 |
| 2002/0097941 | A1* | 7/2002 | Forrest .................... H01S 5/0265 385/1 |
| 2005/0185889 | A1* | 8/2005 | Xia .......................... B82Y 20/00 385/43 |
| 2010/0246617 | A1* | 9/2010 | Jones ...................... G02B 6/124 372/26 |
| 2011/0299561 | A1* | 12/2011 | Akiyama ............. H01S 5/02248 372/50.11 |
| 2012/0300796 | A1* | 11/2012 | Sysak ................... H01S 5/1032 372/6 |
| 2013/0259077 | A1* | 10/2013 | Ben Bakir .......... G02B 6/12004 372/44.01 |
| 2014/0369700 | A1* | 12/2014 | Debregeas-Sillard ........ H01S 5/0622 398/192 |
| 2015/0030282 | A1* | 1/2015 | Park ................... G02B 6/12004 385/14 |
| 2015/0055669 | A1* | 2/2015 | Tani ........................ H01L 33/34 372/45.01 |
| 2015/0132002 | A1* | 5/2015 | Krishnamurthy ... H01S 5/06255 398/79 |
| 2016/0094014 | A1* | 3/2016 | Shin ....................... H01S 5/2031 372/45.01 |
| 2016/0252692 | A1* | 9/2016 | Hofrichter ............. H01S 5/0014 250/227.11 |
| 2016/0327759 | A1* | 11/2016 | Keyvaninia ............ H01S 5/0218 |
| 2017/0098922 | A1* | 4/2017 | Hatori .................... H04B 10/40 |
| 2017/0133824 | A1* | 5/2017 | Liang .................... G02B 6/3536 |
| 2017/0141541 | A1* | 5/2017 | Ferrotti ................. H01S 5/2027 |
| 2017/0214216 | A1* | 7/2017 | Dong .................... H01S 5/1014 |
| 2018/0241176 | A1* | 8/2018 | Abel ..................... H01S 5/1032 |
| 2018/0261978 | A1* | 9/2018 | Kurczveil ............. H01S 5/1092 |

OTHER PUBLICATIONS

H. Duprez er al. "Hybrid III-V on silicon laterally-coupled distributed feedback laser operating in the O-band" IN: IEEE Photonics Technology Letters, Sep. 15, 2016, vol. 28, No. 18, pp. 1920-1923.

Po Dong et al. "Novel intergration technique for silicon/III-V hybrid laser" IN: Optics Express, Nov. 2014, vol. 22, No. 22, pp. 26861-26868.

Thomas Ferrotti et al. "O-Band III-V-on-Amorphous-Silicon Lasers Integrated With a Surface Grating Coupler" IN: IEEE: Photonics Technology Letters, Sep. 15, 2016, vol. 28, No. 18, pp. 1944-1947.

J. Durel et al. "Realization of Back-Side heterogeneous hybrid III-V /Si DBR Lasers for Silicon Photonics" IN: Integrated Optics: Devices, Material and Technologies XX, Mar. 2016, vol. 9750, pp. 975000.

J. Durel et al. "First Demonstration of a Back-Side Integrated Heterogeneous Hybrid III-V / Si DBR Lasers for Si-Photonics Applications" IN: Electron Devices Melting (IEDM), 2016 IEEEE International, Dec. 2016, pp. 22.2.1-22.2.4.

B. Ben Bakir et al. "Electrically friven hybrid Si/III-V Fabry-Pérot lasers based on adiabatic mode transformers" IN: Optics Express, May 23, 2011, vol. 19, No. 11, pp. 10317-10325.

Keyvaninia S. Et al. "Heterogeneously integrated III-V /silicon distributed feedback lasers" IN: Optics Letters, Dec. 15, 2013, vol. 38, No. 24 pp. 5434-5437.

* cited by examiner

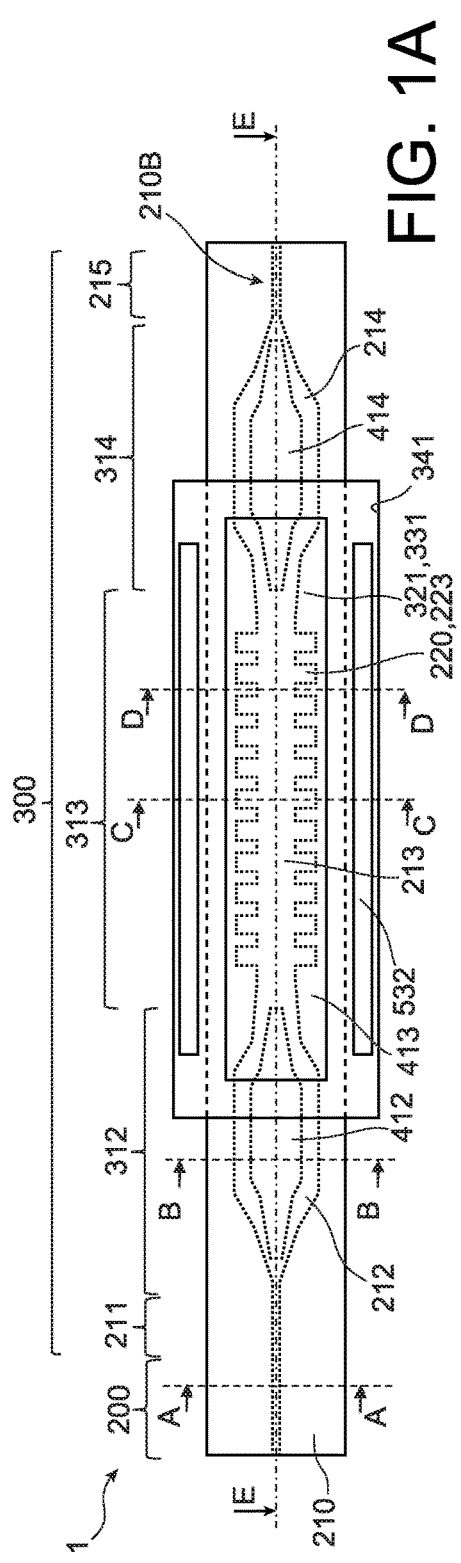
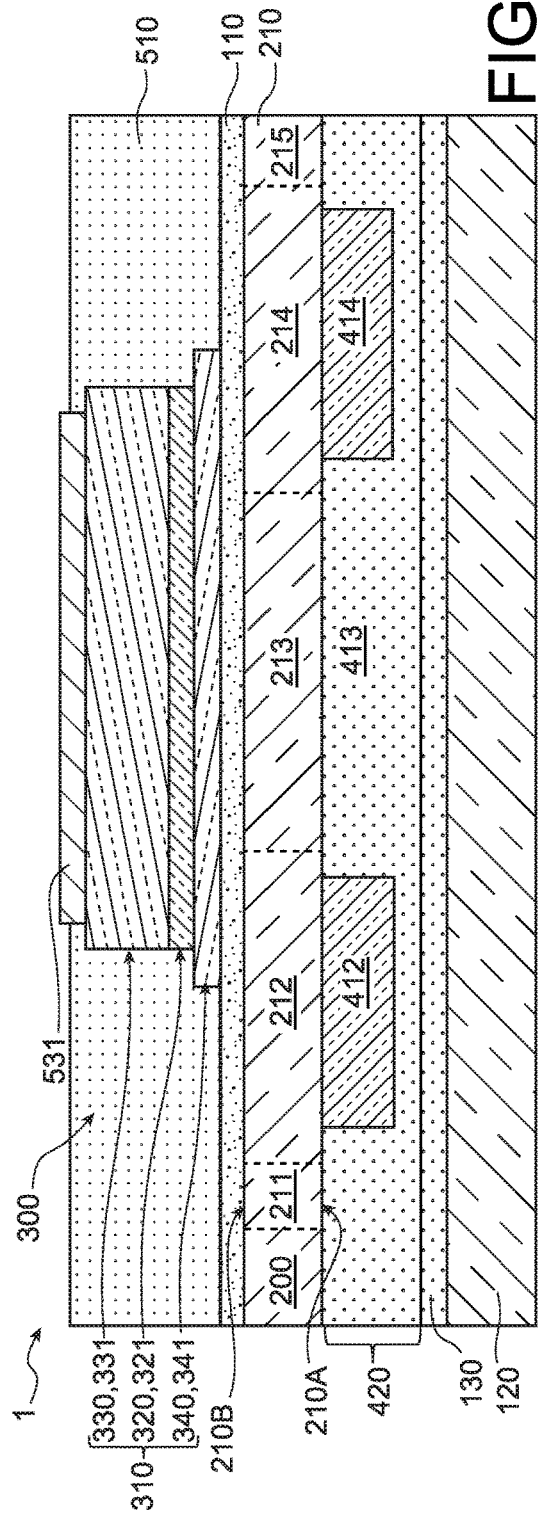
FIG. 1A
FIG. 1B

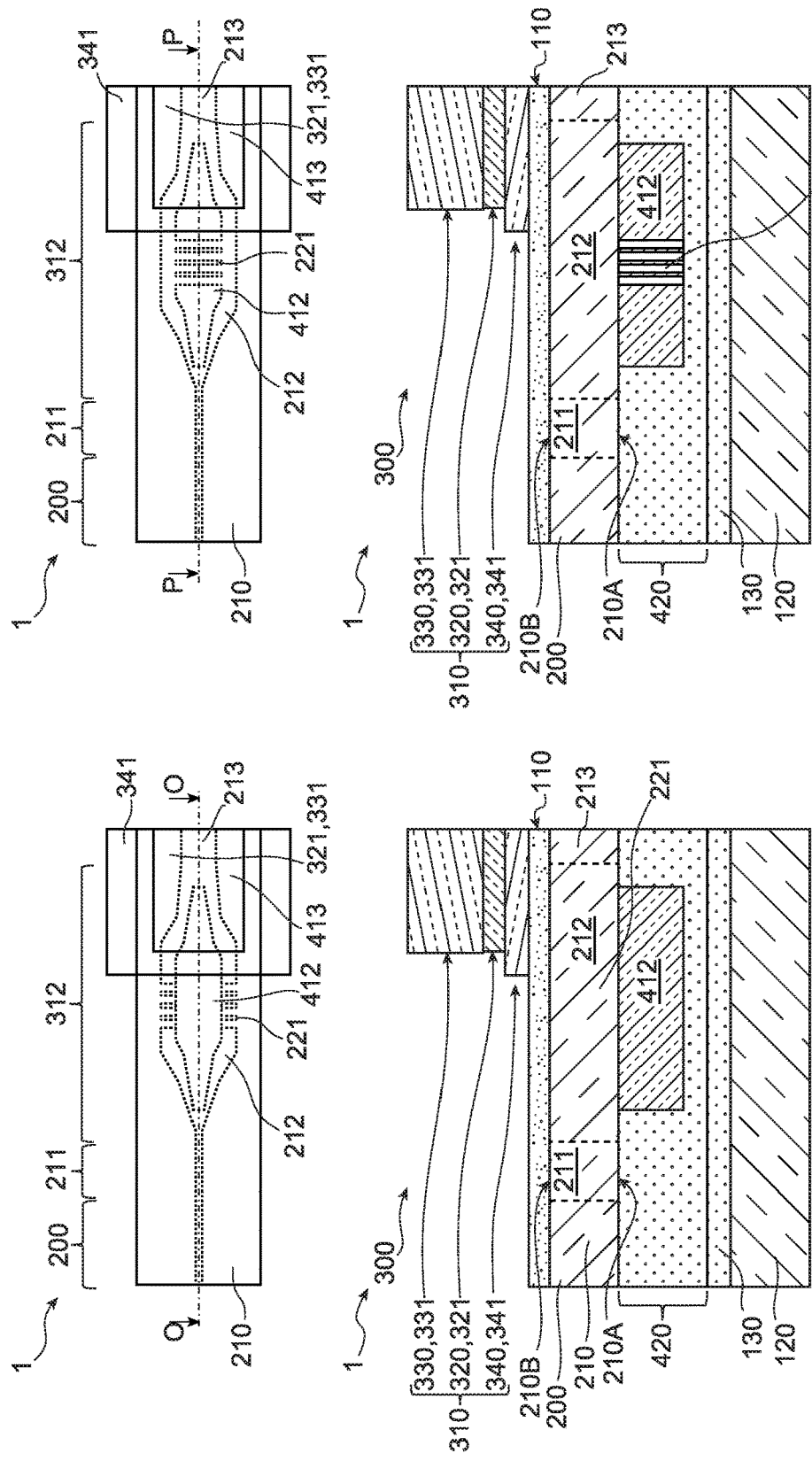

PHOTONIC DEVICE COMPRISING A LASER OPTICALLY CONNECTED TO A SILICON WAVE GUIDE AND METHOD OF FABRICATING SUCH A PHOTONIC DEVICE

TECHNICAL DOMAIN

The invention relates to the domain of optoelectronics and photonics devices.

More precisely, the purpose of the invention is a photonic device comprising a silicon waveguide designed to accommodate several silicon photonic components and a hybrid laser on silicon comprising a gain medium capable of emitting light.

STATE OF PRIOR ART

The fabrication of hybrid photonic devices integrating silicon photonic components and at least one hybrid laser on silicon comprising a gain medium capable of emitting light, such as a gain medium made from Ill-V semiconducting materials, must necessarily take account of design constraints on the dimensions of the first silicon waveguide accommodating the silicon photonic components and the second silicon waveguide used in the composition of the hybrid laser. Such a hybrid laser generally comprises:

a gain structure comprising at least one gain medium capable of emitting light, the gain structure being subjacent to a section of the second silicon waveguide to form a hybrid waveguide with it, an optical feedback structure to form an oscillating cavity comprising the gain medium of said gain structure, and optical transitions between the second silicon waveguide and the hybrid waveguide.

In the above and throughout this remainder of this document, the term "gain structure" means a structure with semiconducting materials adapted to supply an emission of light that can be stimulated particularly to output a laser type emission when such a structure is coupled to an optical feedback structure such as a Bragg grating distributed along said gain structure. Such a gain structure comprises at least one gain medium that is the material in which the light emission is generated and, on each side, a first and second zone with opposite types of conductivity to enable electrical pumping of the gain medium. In a classical application of lasers with semiconducting materials, particularly to create an emission within the range of infrared wavelengths and particularly at wavelengths of 1310 nm and 1550 nm, the first and the second zones and the gain medium are formed by epitaxial growth on indium phosphide InP or gallium arsenide GaAs substrates. The small difference in the lattices of these materials with their quaternary alloys makes it possible to obtain first and second zones and a gain medium with good crystalline quality ideal to optimise the efficiency of the laser emission.

The gain medium with such a gain structure may comprise a succession of quantum wells supplying light emission. These quantum wells are usually surrounded by two barrier layers so as to increase the confinement factor of the optical mode in the quantum wells. As an alternative to quantum wells, the gain medium can also comprise quantum dots. In order to form such quantum wells or quantum dots, in a classical configuration of such a hybrid laser, the gain medium may comprise at least two semiconducting materials, for example chosen from among the group including indium phosphide, InP, gallium arsenide GaAs, indium arsenide InAs, gallium-indium arsenide-phosphide InGaAsP, gallium-indium-aluminium arsenide InGaAlAs, aluminium-gallium arsenide AlGaAs and indium arsenide-phosphide InAsP, and alloys of them. Similarly, the first and the second zones can be composed of at least one semiconducting material chosen from the group including indium phosphide InP, gallium arsenide GaAs, indium arsenide InAs, gallium-indium arsenide-phosphide InGaAsP, gallium-indium-aluminium arsenide InGaAlAs, aluminium-indium arsenide-nitride InGaAsN, aluminium-gallium arsenide AlGaAs and indium arsenide-phosphide InAsP, and alloys of them, one of the first and second zones having a first type of conductivity in which the majority carriers are electrons and other having a second type of conductivity in which the majority carriers are holes.

Such gain structures may be of the "vertical" type or the "lateral" type. In the first case, in other words a "vertical" type of gain structure, the first zone, the gain medium and the second zone are composed of a stack of layers at the surface of a support. In such a configuration, the thickness of the stack forming the gain structure is generally between 1 and 3 µm. In the second case, in other words a "lateral" type of gain structure, the first zone, the gain medium and the second zone are in succession in contact along a support. The typical thickness of a lateral type of gain structure is of the order of 500 nm.

In the above and throughout this document, the term "optical feedback structure" means an optical structure made in a waveguide in order to form an oscillating guide cavity comprising the gain medium. Thus, the optical field makes forward/return passes in the waveguide of the cavity between the ends of this oscillating cavity, in order to generate a stimulated emission from the gain medium.

In the case of a laser called a Distributed Feedback Laser (DFB), the optical feedback structure is composed of a distributed reflector such as a Bragg grating, under or in the gain structure, forming a mirror selective in wavelength.

In the case of a Distributed Bragg Reflector (DBR) Laser, the feedback structure is composed of reflectors located in the waveguide, on each side of the gain structure.

Thus, in such a photonic device, the first silicon waveguide accommodates silicon photonic components such as passive components (for example, and non-limitatively, surface coupling gratings, optical multiplexers/demultiplexers of the arrayed waveguide grating (AWG) or blazed grating type, resonant rings) and such as active components (for example and non-limitatively, modulators formed by P and N doping of the silicon waveguide). These components that are accommodated in the first waveguide require a relatively thin waveguide, generally with a thickness of the order of 220 nm to 300 nm. This is the case particularly for modulators so that they will have an optimised passband, and for resonant rings so that they will have a resonant wavelength with low dispersion.

On the other hand, integration of the hybrid laser requires the use of a second silicon waveguide with a larger thickness of silicon, usually greater than or equal to 500 nm. Further information about these constraints for integration of a hybrid laser into such a photonic device is given particularly by Po Dong et al. in their work published in the scientific journal "Optics Express" Vol. 22 No. 22 in November 2014 pages 26861 to 26868. Furthermore, since the first and second waveguides do not have the same thickness, such a device necessarily includes transitions between the first silicon waveguide and the second silicon waveguide.

Different fabrication methods and photonic devices have been disclosed to satisfy these design constraints.

A first fabrication method described by Duprez H. and his co-authors in the "IEEE Photonics Technology Letters" scientific journal Vol. 28 No. 18 pages 1920-1923, September 2016, comprises the following steps:

supply a substrate associated with a silicon layer on a first dielectric layer, the silicon layer being 500 nm thick, a step to partially thin the silicon layer to form a first and a second zone in which the silicon thicknesses are 300 nm and 500 nm respectively, and several silicon patterning steps to form a first 300 nm thick silicon waveguide in the first zone, said waveguide accommodating a surface coupling grating (called "grating to fiber coupler" by the coauthors), and the silicon parts forming the hybrid laser on silicon in the second 500 nm thick part, and more particularly the second silicon waveguide, the optical feedback structure (distributed Bragg grating accommodated in a section of the second waveguide that will be subjacent to the gain structure), and the optical transition zones of the hybrid laser waveguide, encapsulation of the partially thinned silicon layer patterned by a dielectric material and planarisation to form a second plane dielectric layer, formation of a gain structure at the second silicon waveguide in contact with the second dielectric layer, such a formation being used to form the hybrid laser waveguide, in particular comprising a part of the gain structure and the optical feedback structure.

Therefore such a method can provide a hybrid photonic device comprising a first waveguide with a thickness of 300 nm and therefore capable of accommodating optimised silicon components while including a hybrid laser that is also optimised, by means of the second 500 nm thick zone. Nevertheless, such a fabrication method and the photonic device that can be fabricated using it, have a number of disadvantages.

Indeed, such a fabrication method makes use of an etching step to locally thin the first silicon layer to form the first waveguide with a thickness of 300 nm. This result of such thinning is that the roughness of the first waveguide is high, which has the consequence of introducing relatively high optical losses. Moreover, the thickness of the first waveguide has significant dispersion that can degrade operation of components accommodated in it (particularly increased dispersion of the central wavelength of resonant ring type filters or AWG multiplexers/demultiplexers, or with blazed gratings). Furthermore, due to the need to encapsulate the first and second zones in a dielectric material, the second zone that is 200 nm thicker than the first zone, and the need to planarise this dielectric material to form the second dielectric layer, the thickness of the second dielectric layer is not well controlled and its dispersion is greater than or equal to ±20 nm. The result is that the gain structure and the second zone that in particular accommodates the optical feedback structure, are separated from each other by a dielectric thickness equal to at least 50 nm±20 nm or even 75 nm. The result is poor control over confinement of the optical mode in the gain medium and the reflecting capacity of the optical feedback structure.

Furthermore, the cross-section of the second silicon waveguide subjacent to the gain structure and that in particular accommodates the optical feedback structure, is 500 nm thick. The result is that the optical mode in the hybrid laser waveguide is drawn towards the silicon layer and consequently, confinement of the optical mode in the gain medium is reduced. Therefore the efficiency of the laser emission is not optimised.

A second method is described by Po Dong et al. in their work published in the "Optics Express" scientific journal Vol. 22 No. 22, November 2014 pages 26861 to 26868 and by Ferrotti T. et al. in the "IEEE Photonics Technology Letters" scientific journal Vol. 28 No. 18 pages 1944 to 1947.

This method comprises the following steps:

supply a substrate associated with a first 300 nm silicon layer on a first dielectric layer, the first silicon layer thus being the thickness of the first waveguide, pattern the first silicon layer to form the first waveguide and a waveguide section distinct from the first waveguide, the first waveguide accommodating a surface coupling grating, formation of an excess thickness of silicon accommodating the optical feedback structure by deposition of a second silicon layer at least partially covering the first patterned silicon layer, the cumulated thickness of the excess thickness of silicon and the first silicon layer being equal to 500 nm to enable formation of the second optical waveguide, one section of which will be underneath the gain structure and will form the hybrid waveguide and the transition zones with the gain structure, encapsulation of the first patterned silicon layer and the excess thickness, associated with the optical feedback structure that it accommodates, by a dielectric material and formation of a second dielectric layer, formation of a gain structure, comprising at least one gain structure made of an III-V semiconductor, the gain structure being in contact with the second dielectric layer.

It will be seen that the work done by Dong et al. and Ferrotti T. et al. differ in that they use monocrystalline silicon deposited in contact with the first silicon layer, and a layer of amorphous silicon deposited in contact with an oxide layer, respectively.

Nevertheless, with such a method, the quality of silicon forming the excess thickness, either with monocrystalline silicon selectively epitaxied on the first silicon layer or with amorphous silicon, is relatively low particularly in comparison with that obtained by a silicon on insulator layer. Thus, losses in waveguides made in such silicon (epitaxied or deposited) are relatively high compared with losses from a waveguide formed in a silicon on insulator layer. Thus, with such a method, the hybrid laser waveguide is made from relatively low quality silicon and optical losses in the hybrid waveguide are higher than they are with a photonic device according to the first method described above. In the same way as for the first fabrication method, the thickness of the second dielectric layer that separates the waveguide and particularly the optical feedback structure accommodated in it, is badly controlled and its dispersion is greater than or equal to ±20 nm. The result is that the gain structure and the second zone associated with the optical feedback structure, are separated from each other by a dielectric thickness equal to at least 50 nm±20 nm or even 75 nm±50 nm. This leads to poor control over confinement of the optical mode in the gain medium and the reflecting capacity of the optical feedback structure.

Furthermore and in exactly the same way as the first method described above, the cross-section of the second silicon waveguide subjacent to the gain structure and that in particular accommodates the optical feedback structure, is 500 nm thick. The result is that the optical mode in the hybrid laser waveguide is drawn towards the silicon layer and consequently, confinement of the optical mode in the gain medium is reduced. Therefore the efficiency of the laser emission is not optimised.

A third method, described particularly in document EP2988378, includes the following steps:

- supply a substrate associated with a layer of silicon (denoted SOI) on a first dielectric layer (denoted BOX), the layer of silicon (SOI) being 500 nm thick,
- patterning of the silicon layer to shape the first and the second silicon waveguides on a part of the thickness of the silicon layer, the remaining thickness being kept, the pattern of the silicon layer being adapted to form optical transition zones and the waveguide section that will be subjacent to the gain structure, in the second waveguide,
- encapsulation of the patterned silicon layer by a dielectric material and planarisation to form a second dielectric layer,
- transfer of the substrate/silicon layer/second dielectric layer assembly on a support and eliminate the substrate and the first dielectric layer (BOX),
- localised thinning in a first zone of the silicon layer to thin the first waveguide to a thickness of 300 nm, the second waveguide remaining 500 nm thick
- patterning the second waveguide to form the optical feedback structure accommodated in the waveguide section that will be subjacent to the gain structure,
- encapsulation of the silicon layer in a third dielectric layer,
- formation of a gain structure in contact with the third dielectric layer, the gain structure with the section of the second silicon waveguide that is immediately subjacent to it forming the hybrid laser waveguide, the laser thus being formed by the gain structure, the feedback structure and the optical transition zones, and the photonic device being formed by the laser and the first silicon waveguide.

Such a method uses several steps for etching and encapsulation of the silicon layer that can compromise the precision of the thickness of the first waveguide, generating losses in it, and therefore can compromise the optical performances of silicon components accommodated in the first waveguide. Similarly, like the first and second methods described above, with such a fabrication method, the thickness of the dielectric layer that separates the waveguide from the gain structure is badly controlled, thus the dispersion of the gain structure is more than ±20 nm. The result is that the gain structure and the second zone that in particular accommodates the optical feedback structure, are separated from each other by a dielectric thickness equal to at least 50 nm±20 nm or even 75 nm±50 nm. The result is poor control over confinement of the optical mode in the gain medium and the reflecting capacity of the optical feedback structure.

Furthermore and in exactly the same way as the first and second methods described above, the cross-section of the second silicon waveguide subjacent to the gain structure and that in particular accommodates the optical feedback structure, is 500 nm thick. The result is that the optical mode in the hybrid laser waveguide is drawn towards the silicon layer and consequently, confinement of the optical mode in the gain medium is reduced. Therefore the efficiency of the laser emission is not optimised.

PRESENTATION OF THE INVENTION

The invention aims to overcome at least one of these disadvantages and thus its purpose is to provide a photonic device comprising a laser with optimised optical confinement in the gain medium and lower losses than lasers in optical devices according to prior art.

The invention relates to a photonic device comprising:
- a support,
- an intermediate layer in contact with the support and comprising at least one dielectric material and a first and second excess thickness of silicon, the first and second excess thicknesses of silicon being separated from each other by a space,
- a first silicon layer in contact with the intermediate layer opposite the support, the first silicon layer comprising at least part of the thickness of a waveguide, and a first to a fifth waveguide sections distinct from the waveguide, the first to the fifth waveguide sections succeeding each other and being optically connected to the waveguide by at least either the first or the fifth waveguide section, the second, the fourth and the third waveguide section facing the first and second excess thicknesses and the space respectively,
- a first dielectric layer covering the first silicon layer opposite the intermediate layer,
- a gain structure comprising at least one gain medium capable of emitting light, the gain structure having a central portion facing the space and a first and a second end facing the first and the second excess thickness, thus the central portion of the gain structure with the space and the third waveguide section forms a hybrid laser waveguide, the second and the fourth waveguide sections, the first and the second excess thicknesses of silicon, and the first and second ends of the gain structure forming a first and a second optical transition zone of an optical mode between the hybrid laser waveguide and the first and fifth sections respectively of the waveguide,
- a feedback structure to form an oscillating cavity comprising at least part of the gain medium so as to form a laser optically connected to the waveguide by at least either the first or the fifth waveguide section.

With such a photonic device, the optical transition between the first and fifth waveguide sections and the hybrid laser waveguide is obtained without making use of an excess thickness over the entire length of the gain structure. The result is that the optical connection between the laser and the waveguide is not made at the detriment of a significant reduction of the optical confinement in the gain medium. The silicon layer under the gain structure away from the transition zones is relatively thin, corresponding to the thickness of the silicon waveguide. Therefore the emission efficiency of the laser is better than in photonic devices according to prior art that do not have such optimised confinement.

Furthermore, at the two ends of the gain structure, the optical transition zones can provide an optical transition of the laser emission to the waveguide that is practically the same as in prior art. Thus, the first and second optical transition zones provide an adiabatic transition of the optical mode between the hybrid laser waveguide and the first and fifth sections respectively of the waveguide. Therefore, the optical confinement of the photonic device is optimised without significantly affecting the transition of the laser emission to the thinner silicon waveguide.

The third waveguide section can accommodate a distributed reflector forming the feedback structure.

The distributed reflector may be a distributed Bragg grating selected from the group including distributed Bragg gratings with lateral corrugations partially etched in a thickness of the first silicon layer, distributed Bragg gratings with lateral corrugations fully etched in the thickness of the first silicon layer, distributed Bragg gratings with vertical corrugations partially etched in the thickness of the first silicon layer and distributed Bragg gratings with vertical corrugations fully etched in the thickness of the first silicon layer.

With such distributed Bragg gratings accommodated in the third waveguide section, the laser is a distributed feedback (DFB) laser. In particular, it benefits from the improved confinement of the gain medium provided by the invention.

The laser may have one of the following two characteristics in order to obtain longitudinal single mode operation:
  the distributed Bragg grating comprises a quarter wave type phase skip
  either the first or the fifth waveguide section accommodates an almost total reflector, the total reflector possibly being selected from among Sagnac type reflectors, distributed Bragg gratings, facet type mirrors with high reflectivity treatment, the first waveguide being connected only to the other first or fifth waveguide. In this way, the laser has a perfectly longitudinal single mode emission.

The thickness of the first dielectric layer may be less than or equal to 75 nm.

The distributed reflector can be selected from the group comprising distributed Bragg gratings with lateral corrugations partially etched in a thickness of the first silicon layer and distributed Bragg gratings with vertical corrugations partially etched in the thickness of the first silicon layer,
  and the part of the thickness of the first silicon layer in which the corrugations are etched being the part of the thickness of the first silicon layer that is opposite the first dielectric layer and the gain structure.

The thickness of the first dielectric layer may be less than or equal to 50 nm or even less than or equal to 30 nm.

The first and the fifth waveguide sections may accommodate a first and a second mirror respectively so as to form an oscillating cavity comprising the gain medium, the first and the second mirrors forming a feedback structure.

Each of the first and the second mirrors may be selected from the group comprising Sagnac type mirrors, facet type mirrors and distributed Bragg gratings.

The second and the fourth waveguide sections may accommodate a first and a second distributed Bragg grating respectively so as to form an oscillating cavity comprising the gain medium, the first and the second distributed Bragg gratings forming a feedback structure.

The first and the second excess thicknesses accommodate a first and a second distributed Bragg grating respectively so as to form an oscillating cavity comprising the gain medium, the first and the second distributed Bragg gratings forming the feedback structure.

In this way, the first and the second mirrors or Bragg gratings delimit an oscillating cavity comprising the gain medium of the gain structure, with optimised confinement, the optical mode not being drawn towards the third waveguide section that is relatively thin.

The gain structure is chosen from the group comprising gain structures of the "vertical junction" type and gain structures of the "lateral junction" type.

Both of these two types of gain structure benefit from the advantage of the invention. It will be noted that this is the case particularly for a "lateral junction" gain structure, known for its small thickness, generally less than 500 nm, because it is possible to use a first thin silicon layer to form the third waveguide section, and therefore to maximise the quantity of energy of the optical mode confined in the gain medium, without adversely affecting the optical transition.

The layout of the waveguide may be chosen from among:
  a layout with the waveguide entirely in the first silicon layer,
  a layout with a first part of the waveguide thickness in the first silicon layer and a second part of the waveguide thickness in a third excess thickness of silicon,
  a layout with a first part of the waveguide thickness in the first silicon layer and a second part of the waveguide thickness in a fifth excess thickness formed in a material of the gain structure,
  a combination of at least two of the above-mentioned arrangements.

The first waveguide can accommodate at least one optical component, the optical component preferably being chosen from the group comprising silicon optical modulators with a PN junction, III-V semiconductor on silicon hybrid modulators, surface coupling gratings, edge couplers, optical filters, wavelength multiplexers and demultiplexers, and photodetectors including germanium on silicon photodetectors and III-V semiconductor on silicon detectors.

The thickness of the first dielectric layer may be less than or equal to 30 nm.

The thickness of the first silicon layer may be less than or equal to 300 nm, and is preferably equal to 300 nm.

The first dielectric layer and the first silicon layer may be an insulating layer and a silicon layer respectively of a silicon on insulator type substrate.

The first and second excess thicknesses of silicon are each made from a silicon selected from among a monocrystalline silicon, an amorphous silicon and a polycrystalline silicon.

The at least one third excess thickness may be made from the same material as the first and second excess thicknesses.

At least one among the second waveguide section and the first excess thickness and one out of the fourth waveguide section and the second excess thickness can have a tapered shape and/or at least one trapezoidal end, at the first and second ends of the gain structure respectively.

The shape of at least one among the first and the second ends of the gain structure may be tapered and/or trapezoidal.

A first and a second electrical contact can be in contact with the gain structure in order to polarise the gain structure.

The invention also relates to a method of fabricating a photonic device comprising at least one silicon waveguide and a laser comprising a gain medium capable of emitting light, the method comprising the following steps:
  supply a substrate associated with a first silicon layer on a first dielectric layer,
  pattern the first silicon layer to form, in the first silicon layer, at least part of the thickness of a waveguide, and first to fifth waveguide sections distinct from the waveguide, the first to the fifth waveguide sections succeeding each other and being optically connected to the waveguide by at least either the first or the fifth waveguide section,
  formation of a first and a second excess thickness of silicon separated from each other by a space, the first and the second excess thickness and the space facing the second, fourth and third waveguide sections respectively or zones of the first silicon layer that will formed its,
  burial of at least the first and second excess thicknesses of silicon by at least one dielectric material and planarisation of said dielectric material to form an intermediate layer, a substrate/first dielectric layer/first silicon layer/intermediate layer assembly thus being formed, supply a support, assemble the substrate/first dielectric layer/first silicon layer/intermediate layer assembly on the support, the assembly being made by bonding the intermediate layer on the support, eliminate the substrate, formation of a gain structure comprising at least the gain medium, the gain structure being formed in contact with the first dielectric layer and having a central portion of the gain structure facing the space and a first and a second end facing the first and the second excess thickness, thus the central portion of the gain structure with the space and the third waveguide section forms a hybrid laser waveguide, the second and the fourth waveguide sections, the first and the second excess thicknesses of silicon, and the first and second ends of the active zone forming a first and a second optical transition zone of an optical mode between the hybrid laser waveguide and the first and fifth sections respectively of the waveguide, the photonic device thus being formed, and in which a feedback structure is also formed to form an oscillating cavity comprising at least partly the gain medium and thus form a laser optically connected to the waveguide by at least one of the first and the fifth waveguide sections during at least one of the steps among the step to pattern the first silicon layer and the step to form the first and the second excess thicknesses of silicon.

Such a method can be used to fabricate a device benefiting from the advantages of the invention.

It will also be noted that with such a device, it is possible to furnish a photonic device in which the thickness of the first dielectric layer is less than or equal to 30 nm with control of ±2 nm on this thickness, that is not achievable with methods according to prior art.

It will also be noted that the first silicon layer is a silicon layer on a dielectric layer, as is obtained by a silicon on insulator substrate that consequently has an optimum crystalline quality. Thus, the third waveguide section subjacent to the gain structure and therefore with which the gain structure interacts, has an optimum crystalline quality. Therefore optical losses at the hybrid laser waveguide are reduced.

Similarly, although the advantages mentioned above relate to the individual fabrication of a single photonic device according to the invention, these advantages are also applicable during a fabrication method according to the invention in which several photonic devices are fabricated collectively by parallel application of the fabrication steps. In particular, it will be noted that the thickness of the first dielectric layer is uniform in all photonic devices formed so as to provide relatively homogeneous performances/characteristics, unlike photonic devices formed with a method according to prior art.

The fabrication method may be a method of fabricating a plurality of photonic devices, the steps in the method being applied to form said devices in parallel.

The feedback structure can be formed during the patterning step of the first silicon layer, patterning of the first silicon layer also including the formation of a distributed reflector forming the feedback structure accommodated in the third waveguide section.

With such a reflector accommodated in the third waveguide section, the method can be used to fabricate a photonic device comprising a Distributed Feedback (DFB) laser. Such a photonic device fabricated by such a fabrication method benefits particularly from:

concerning the laser, the improved confinement in the gain medium provided by the invention, the good crystalline quality of the first silicon layer, and the resulting low optical losses, and the controlled thickness of the first dielectric layer, concerning the waveguide and the optical components that it accommodates, the use of a first silicon layer with a good crystalline quality and therefore low optical losses, and controlled thickness, and a first dielectric layer with controlled thickness.

the feedback structure can be formed during the patterning step of the first silicon layer, the patterning of the first silicon layer also including the formation of a first mirror accommodated in one among the first and second waveguide sections and a second mirror accommodated in either the fourth or the fifth second waveguide section, the first and a second mirror thus forming an oscillating cavity comprising the gain medium.

The feedback structure can be formed during the step in which the first and the second excess thicknesses of silicon are formed, formation of the first and second excess thicknesses of silicon also comprising the formation of a first and a second Bragg grating accommodated in a first and second excess thickness of silicon respectively, the first and a second mirror thus forming an oscillating cavity comprising the gain medium.

The patterning step of the first silicon layer may be done prior to the step to form the first and second excess thicknesses of silicon.

When the patterning step of the first silicon layer is done after the step to eliminate the substrate and in which the patterning step of the first silicon layer is a step to pattern the first silicon layer and the first dielectric layer.

A step to thin the first dielectric layer may also be included between the steps to eliminate the substrate and to form the gain structure.

Thus, the first dielectric layer may have a perfectly controlled thickness, because it is the result of thinning a perfectly plane layer.

The step to form the first and the second excess thicknesses of silicon may be selected from among the following group of formation steps:

selective deposition of silicon in contact with the first silicon layer to form the first and second excess thicknesses of silicon, deposition of a second silicon layer and local etching of the second silicon layer to form the first and second excess thicknesses of silicon, assembly of a second silicon layer on the first silicon layer and local etching of the second silicon layer to form the first and second excess thicknesses of silicon, Silicon excess thicknesses with good optical quality can be provided with such steps to form the first and second excess thicknesses.

The fabrication method may also comprise the following step:

formation of at least one third excess thickness of silicon covering parts of the first silicon layer that are patterned or that will be patterned, the third waveguide section not having any additional excess thickness of silicon, and at least one third excess thickness of silicon can form part of the waveguide.

In this way, the thickness of the third waveguide section and of the waveguide can be controlled independently of each other. This is particularly advantageous for a device comprising a gain structure with "lateral junction".

During the step to form the gain structure, it is also possible to form a semiconducting zone in at least one semiconducting material forming the facing gain structure with a portion of the first waveguide in order to form a hybrid modulator accommodated in said first waveguide.

BRIEF DESCRIPTION OF THE DRAWINGS

This invention will be better understood after reading the description of example embodiments given purely for information and that are in no way limitative, with reference to the appended drawings on which:

FIGS. 1A to 1H illustrate a simplified top view, a longitudinal sectional view along the EE axis, both diagrammatically representing a photonic device according to a first embodiment of the invention comprising a distributed Bragg grating under a gain medium, the Bragg grating being of the "lateral corrugations" type partially etched in a first silicon layer as an optical feedback structure, four diagrammatic sectional views along the AA, BB, CC and DD axes of this same photonic device and two close-up views, one top view and one sectional view along the FF axis, of a "vertical junction" type gain structure installed on said photonic device, respectively.

Figure 1C:
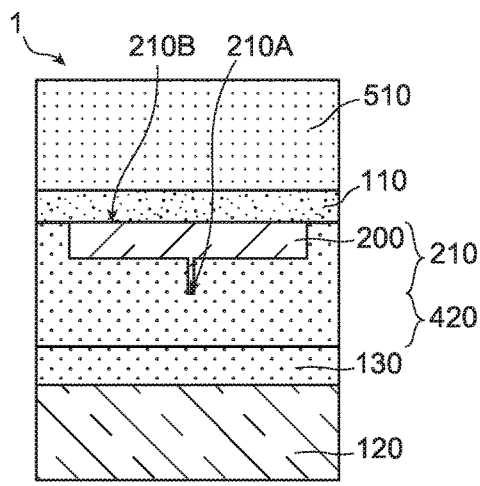

Identical, similar or equivalent parts of the different figures have the same numeric references to facilitate the comparison between the different figures.

The different parts shown on the figures are not all at the same scale to make the figures more easily understandable.

It must be understood that the different possibilities (variants and embodiments) are not mutually exclusive and that they can be combined with each other.

DETAILED PRESENTATION OF PARTICULAR EMBODIMENTS

FIGS. 1A and 1B represent diagrammatic top and sectional views respectively along the EE axis of a first embodiment of a photonic device 1 according to the invention comprising a silicon waveguide 200 and a laser 300 comprising a gain medium 321 capable of emitting light, the laser 300 being optically connected to the waveguide 200.

More precisely, the photonic device 1 comprises:
- a support 120 comprising a second dielectric layer 130 covering the support 120,
- an intermediate layer 420 in contact with the support 120 through the second dielectric layer 130, the intermediate layer 420 comprising at least one dielectric material and a first and a second excess thickness 412, 414 of silicon, the first and a second excess thickness 412, 414 of silicon being separated from each other by a space 413 filled with said dielectric material,
- a first silicon layer 210 in contact with the intermediate layer opposite the support 120, the first silicon layer 210 comprising at least part of a waveguide 200, and first to fifth waveguide sections 211, 212, 213, 214, 215 distinct from the waveguide 200, the first to the fifth waveguide sections 211, 212, 213, 214, 215 succeeding each other and being connected to the waveguide 200 by at least either the first or the fifth waveguide section 211, 215, the second, the fourth and third waveguide sections 212, 214, 213 facing the first and second excess thicknesses 412, 414 and the space 413, respectively,
- a first layer of dielectric material 110 covering the silicon layer 210 on a face of the first silicon layer 210 opposite the intermediate layer 420,
- a gain structure 321 comprising at least one gain medium 321 capable of emitting light, the gain structure 310 having a central portion facing the space 413 and a first and a second end facing the first and the second excess thicknesses 412, 414, thus the central portion of the gain structure 310 with the space 413 and the third waveguide section 213 forms a hybrid laser waveguide, the second and the fourth waveguide sections 212, 214, and the first and the second excess thicknesses 412, 414 of silicon forming a first and a second optical transition zone 312, 314 of an optical mode between the hybrid laser waveguide 313 and the first and fifth waveguide sections 211, 215 respectively, a feedback structure 220 to form an oscillating cavity comprising the gain medium 321 so as to form the laser 300 optically connected to the waveguide 200 by the first waveguide section 211, the feedback structure 220 in this first embodiment of the invention consisting of a distributed Bragg grating 223 accommodated in the third waveguide section 213, a first and a second electrical contact 531, 532 for electrically contacting the gain structure 310, an encapsulation layer 510 encapsulating the gain structure and the first and second electrical contacts 531, 532.

In simplifying matters and as described below, it will be noted that FIGS. 1A and 1B do not illustrate a quarter wave defect in the distributed Bragg grating 223 or the total reflector on one side of the laser; each is known to an expert in the art for emission of a DBF type laser according to a single mode of the cavity. It will also be noted that FIG. 1A has been shown diagrammatically and only includes some components of the photonic device, to make it easier to understand. Thus for example, the electrical contact 531, the encapsulation layer 510, the dielectric material of the encapsulation layer 420 and the support 120 are not shown on FIG. 1A. For the same reason, such a diagrammatic arrangement is also used for all top views of this document and particularly for FIGS. 1G, 2B, 2C, 2G, 3A, 3B, 4A, 9, 10A, 10B and 11A.

The support 120 is a support compatible with the constraints of microelectronics and optoelectronics and may be a support made of a semiconducting material or a dielectric material. In one particular application of the invention, the support may be a support made of crystalline silicon. According to this possibility and according to a variant not illustrated in FIGS. 1A and 1B, the support may also include electronic control and/or readout components complementary to the optical components, such as the laser 300 and components integrated into the waveguide 200, and electrical interconnections connecting said electrical components to said optical components. Similarly and according to a variant to this first embodiment, as described subsequently with reference to FIGS. 7A et 7B, the substrate may also comprise through electrical conducting vias participating in the formation of electrical contacts 531, 532, 533, 534 to make an electrical connection electrical of these same optical components to a second substrate, the second so-called control substrate integrating said electrical control and/or read components complementary to the optical components.

As illustrated on FIG. 1B, the support 120 comprises a second dielectric layer 130.

The second dielectric layer 130 is preferably adapted for assembly of the intermediate layer 420 onto the support 120 by direct bonding. Thus, the second dielectric layer 130 has a second plane bonding surface for this purpose. In the particular application of the invention, the second dielectric layer 130 is composed of silicon dioxide $SiO_2$.

The intermediate layer 420 comprises a first face, preferably forming a first plane bonding surface, through which it is contact with the second dielectric layer 130 and a second face opposite the first face. The intermediate layer 420 also comprises:

the first and second excess thicknesses 412, 414 of silicon separated from each other by a space 413, one or several dielectric materials enclosing the first and the second excess thickness 412, 414 and filling the space 413, said dielectric material preferably forming the first surface of the intermediate layer 420.

The dielectric material of the dielectric layer is preferably made of silicon dioxide $SiO_2$. According to one possibility of the invention, not illustrated on FIGS. 1A to 1B, the intermediate layer may comprise several dielectric materials in the form of several under layers.

The first and second excess thickness 412, 414 are made from a silicon selected from among a monocrystalline silicon, an amorphous silicon or a polycrystalline silicon. The thickness of the first and second excess thicknesses 412, 414 is chosen to enable an adiabatic transition between the hybrid laser waveguide 313 and first and the fifth waveguide sections 211, 215, with the second and fourth waveguide sections 212, 214 and the first and second ends of the gain structure 310, respectively. Thus in one particular application of the invention in which the first silicon layer 210 is 300 nm thick, the first and second excess thicknesses 412, 414 are 200 nm thick.

Obviously, although in a usual configuration of the invention, each of the first and second excess thicknesses 412, 414 has a constant thickness, it could also be envisaged that each of the first and second excess thicknesses 412, 414 has a variable thickness, the maximum thickness then being adapted to enable an adiabatic transition between the hybrid laser waveguide 313 and first and fifth waveguide sections 211, 215, with the second and fourth waveguide sections 212, 214 and the first and second ends of the gain structure 310, respectively.

The first and the second excess thicknesses 412, 414 and the space 413 separating them are arranged in the intermediate layer 420 facing the second, fourth and third waveguide sections 212, 214, 213 respectively formed in the first silicon layer 210.

The shape of the first and second excess thicknesses is also chosen to enable an adiabatic transition between the hybrid laser waveguide 313 and first and the fifth waveguide sections 211, 215, with the second and fourth waveguide sections 212, 214 and the first and second ends of the gain structure 310, respectively. Thus, as illustrated diagrammatically on FIG. 1A, the shape of the first and the second excess thicknesses 412, 414 along a guidance direction of the waveguide 200 is tapered. The cross-sections of each of the first and second excess thicknesses 412, 414, along a direction from the interior of the gain structure 310 towards the exterior of the gain structure 310:

increase along a first part of its length, remain constant along a second part of its length, decrease along a third part of its length, Obviously, such a shape of the first and the second excess thicknesses 412, 414 is given as an example. As exemplified in the remainder of this document, other shapes could perfectly well be envisaged without going outside the framework of the invention as long as said shapes, combined with the shapes of the second and fourth waveguide sections 212, 214 and the shapes of the first and second ends of the active structure 310, enable the formation of a first and a second optical transition zone 312, 314 between the hybrid laser waveguide 313 and the first and the fifth waveguide sections 211, 215 respectively.

The intermediate layer 420 is in contact with the first silicon layer 210 through its second face. The first silicon layer 210 comprises a first face 210A through which it is in contact with the intermediate layer 420 and a second face 210B opposite its first face 210A.

The first silicon layer 210 is a layer of crystalline silicon derived from a silicon layer type substrate 210 on a dielectric layer 110. This type of substrate is best known under the name "silicon on insulator" and the associated abbreviation SOI. In the particular application of the invention, the silicon layer 210 is a silicon layer derived from a silicon substrate comprising a silicon layer on silicon dioxide $SiO_2$, in other words an SOI substrate. Such a silicon layer derived from an SOI type substrate also has the advantage of having a good crystalline quality and controlled thickness, to provide a waveguide 200 with low optical losses. The silicon dioxide layer, which corresponds to the first dielectric layer 110, is also known as "Buried oxide" (BOX). Such a silicon layer derived from an SOI type substrate has the advantage of having good crystalline quality and controlled thickness, to provide a waveguide 200 with low optical losses, and also to provide a first dielectric layer with controlled thickness and planeness as a result of the BOX layer.

The first silicon layer 210 has an appropriate thickness to form the waveguide 200 and the optical components accommodated in the waveguide 200. Thus, in the particular application of the invention, the thickness of the first silicon layer 210 is 300 nm. As a result, the optical components accommodated in the waveguide have an optimal functional configuration.

The pattern on the first patterned silicon layer 210 is such that the first silicon layer 210 comprises the waveguide 200 and the first to the fifth waveguide sections 211, 212, 213, 214, 215.

Obviously, as illustrated in the remainder of this document, particularly with reference to FIGS. 6 to 9, the waveguide may also accommodate other optical components such as an optical modulator and a surface coupling grating, not shown on FIGS. 1A to 1H.

In the practical application of the invention, as illustrated on FIG. 1C representing a sectional view of the waveguide 200 along an axis AA, the waveguide 200 comprises a base on a first part of the thickness of the first silicon layer 210 comprising the second face 210B of the first silicon layer 210, and a portion called the edge with a smaller lateral section than the base on a second part of the thickness comprising the first face 210A of the silicon layer 210.

Obviously, such a waveguide shape simply illustrates the practical application of the invention and other forms could be envisaged without going outside the framework of the invention. Thus for example, the waveguide 200 could also have a constant lateral section or could have a base comprising the first face 210A, without going outside the framework of the invention.

The waveguide 200 is optically connected to the first waveguide section 211. In this first embodiment of the invention, the configuration of the first and fifth waveguide sections 211, 215 is similar to the configuration of waveguide 200. Thus, according to the practical application of the invention, the first and the fifth sections have a sectional view identical to that of the waveguide 200 as illustrated on the section along the XX axis shown on FIG. 1C.

The first to fifth waveguide sections 211, 212, 213, 214, 215 are in succession, therefore the first waveguide section 211 is optically connected to the second waveguide section itself optically connected to the third waveguide section 213, and so on. In this way, the first to the fifth waveguide sections 211, 212, 213, 214, 215 are optically connected to the waveguide 200 through the first waveguide section 211.

Figure 1D:
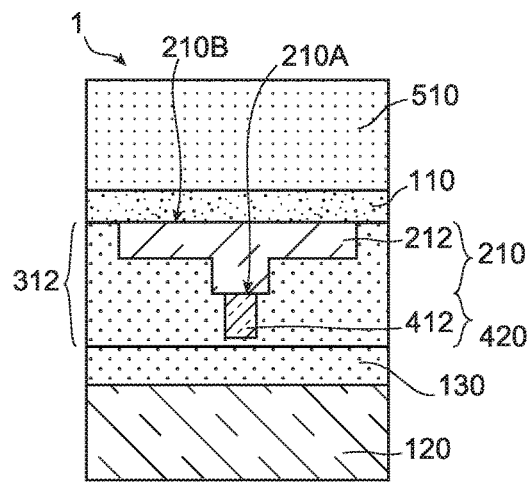

Thus, as diagrammatically illustrated on FIG. 1A, in a similar manner to the first and second excess thicknesses 412, 414, the cross-sections of each of the second and the fourth portions 212, 214 along a direction from the interior of the gain structure 310 towards the exterior of the gain structure 310:

increase along a first part of its length,
remain constant along a second part of its length,
decrease along a last part of its length, According to one possibility of the particular application of the invention shown in the sectional view along the BB axis shown on FIG. 1D, in the same way as the waveguide 200 and the first and fifth waveguide sections 211, 215, each of the second and the fourth waveguide sections 212, 214 may comprise a first and a second part of the waveguide 200 with different transverse widths. Thus, the second part comprising the first face 210A of the first silicon layer 210 has a lower transverse width than the first part that comprises the second face 210B of the first silicon layer 210. According to this possibility, the first part forms a base that can have a constant lateral section, and therefore only the second part called the edge has a tapered shape as illustrated in FIG. 1A. In other words, the edge of the second and fourth waveguide sections 212, 214 is in the form of a trapezium at its two ends, the bases of said trapezium being transverse to the direction of propagation of light, the smallest base being the outermost base of said waveguide section 212, 214. As illustrated on FIG. 1D, the transverse width of the edge of the second and fourth waveguide sections 212, 214 is more than the transverse width of the excess thickness 412, 414 that partly covers it.

Obviously, as will be described in the remainder of this document, other configurations of the first and second portions 211, 212 of the waveguide 200 can also be envisaged without going outside the framework of the invention.

The first silicon layer 210 comprises the optical feedback structure 220 accommodated in the third waveguide section 213. In this first embodiment, the feedback structure 220 is a distributed Bragg grating 223 structure under the central part of the gain structure 310. More precisely, as illustrated in the top view in FIG. 1A, the optical feedback structure 220 is a distributed Bragg grating 223 with "lateral corrugations", in other words the variation of the optical index of the Bragg grating is obtained by a variation of the transverse width of the waveguide.

With such a feedback structure 220, the laser is a distributed feedback (DFB) laser.

Figure 1E:
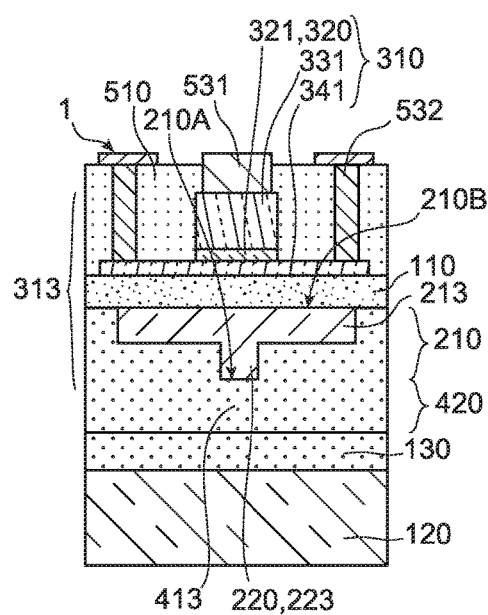
Figure 1F:
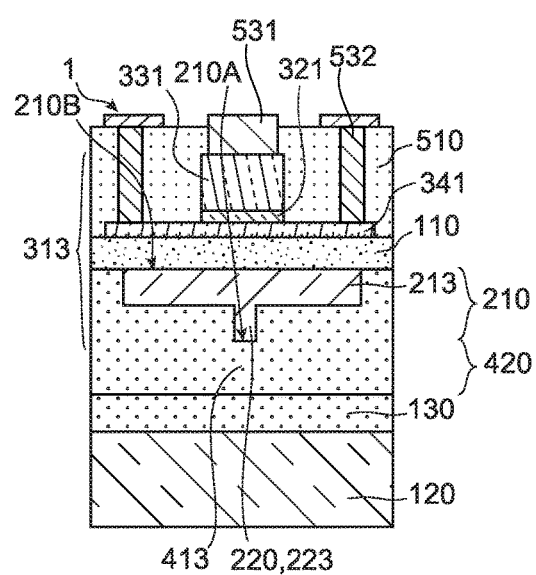

In the practical application of the invention and as illustrated on the sectional views along the CC and DD axes shown on FIGS. 1D and 1E, the variation of the transverse width for the distributed Bragg grating is obtained on a first part of the thickness of the first silicon layer 210 that extends starting from the first face 210A of the first silicon layer 210. Thus, in the same way as in the first, fourth and fifth waveguide sections, the feedback structure 220 comprises a base on a first part of the thickness of the first silicon layer 210 extending from the second face 210B of this layer, and an edge on a second part of the thickness of the silicon layer 210 extending from the first face 210A. The transverse width of the base is constant, this first part of the thickness typically being 150 nm thick. The edge has a relatively large transverse width said to be "wide" alternating with a relatively small transverse width said to be "narrow" to form the distributed Bragg grating 223, the second part of the thickness typically being 150 nm thick. According to the principle of a Bragg grating, the alternation pitch in the edge between the relatively wide transverse width and the narrow transverse width is approximately equal to $\lambda/2n_{eff}$, where $\lambda$ is the emission wavelength of the laser 300 and $n_{eff}$ is the effective mean index of the mode guided by the hybrid waveguide 313. With such a configuration of the distributed Bragg grating, the distributed Bragg grating 223 is a Bragg grating with "lateral corrugations" partially etched in the thickness of the first silicon layer 210.

Obviously, and as shown in the following embodiments of the invention, the feedback structure 220 can be formed from another type of reflector without going outside the framework of the invention. In particular, the distributed reflector 223 can be provided by a distributed Bragg grating with "lateral corrugations" fully etched in the thickness of the first silicon layer 210.

According to one advantageous possibility of the invention not illustrated in FIGS. 1A to 1F and that is applicable in the case in which the optical feedback structure 220 is formed from a distributed reflector, the distributed Bragg grating may comprise a quarter wave type phase defect to optimise selectivity of the oscillating cavity.

As a variant to this possibility and in order to optimise selectivity of the oscillating cavity, the first or the fifth waveguide section 211, 215 can accommodate an almost total reflector, the total reflector possibly being selected from among Sagnac type reflectors, distributed Bragg gratings and facet type mirrors with high reflectivity treatment. As a variant and with the same purpose, it could also be envisaged that one among the second waveguide section 212, the fourth waveguide section 214, the first excess thickness 412, the second excess thickness 414, the assembly of the second waveguide section 212 and the first excess thickness 412, and the assembly of the fourth waveguide section 214 and the second excess thickness 414 could accommodate an almost total reflector, the total reflector possibly being selected from among reflectors of the distributed Bragg grating type and facet type mirrors with high reflectivity treatment The first silicon layer 210, for parts of the first silicon layer 210 hollowed out during a previous operation, comprises a dielectric material, for example the material of the intermediate layer 420.

The second face 210B of the first silicon layer 210 is in contact with the first dielectric layer 110. The first dielectric layer 110 comprises a first face through which it is in contact with the first silicon layer 210 and a second face opposite the first face.

The first dielectric layer 110 is a dielectric layer obtained from a silicon on insulator (SOI) type substrate, which is provided by the insulator on which the first silicon layer 210 is located. According to the practical application of the invention and has already been mentioned with reference to the first silicon layer 210, the first dielectric layer 110 is a silicon oxide layer with a thickness equal for example to 30 or 50 nm.

According to an optional possibility of the practical application of the invention, the first dielectric layer may be an insulating layer of a silicon on insulator type substrate, the thickness of which has been thinned.

The first dielectric layer 110 is in contact with the gain structure 310 through its second face.

As illustrated on FIG. 1, the gain structure 310 comprises:
a first semi-conducting zone 341 with a first type of conductivity formed in a first semiconducting layer 340,
the gain medium 321 formed in a second semiconducting layer 320,
a third semi-conducting zone 331 with a second type of conductivity opposite to the first type of conductivity and formed in a third semiconducting layer 330, According to a usual configuration of the invention, the first, second and third semiconducting layers 340, 320, 330, and therefore the first and third semiconducting zones 341, 331 and the gain medium 321, are all made of direct gap semiconducting materials such as III-V semiconductors. Thus, the first and the third semiconducting layers 340, 330 are preferably made of III-V semiconductors such as indium phosphide InP or gallium arsenide GaAs, while the second semiconducting layer 320 is preferably composed of a stack of binary, ternary or quaternary compounds of III-V semiconducting materials.

The first and second types of conductivity are chosen from among the type of conductivity in which the predominant carriers are electrons, namely as obtained by N doping, and the type of conductivity in which the predominant carriers are holes, namely as obtained by P doping.

Figure 1G:
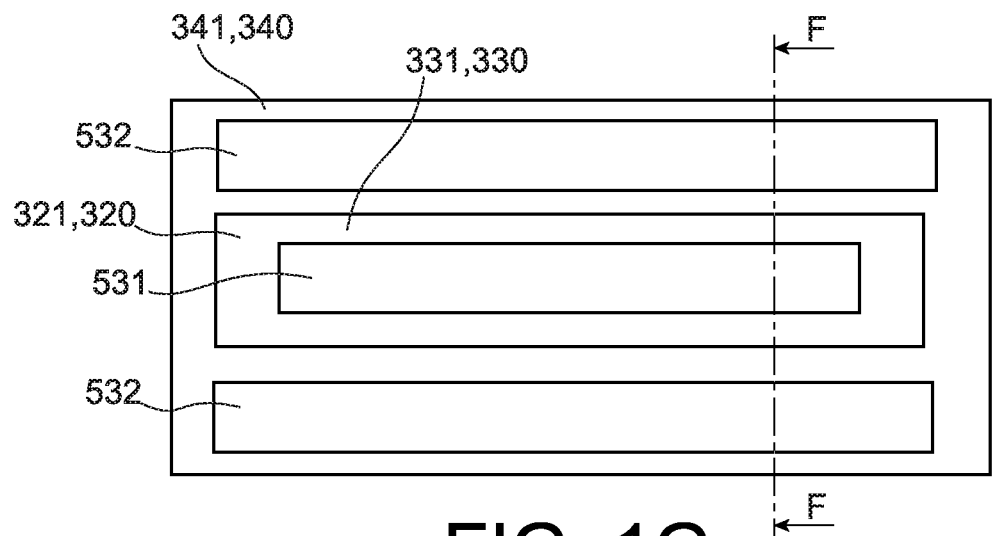
Figure 1H:
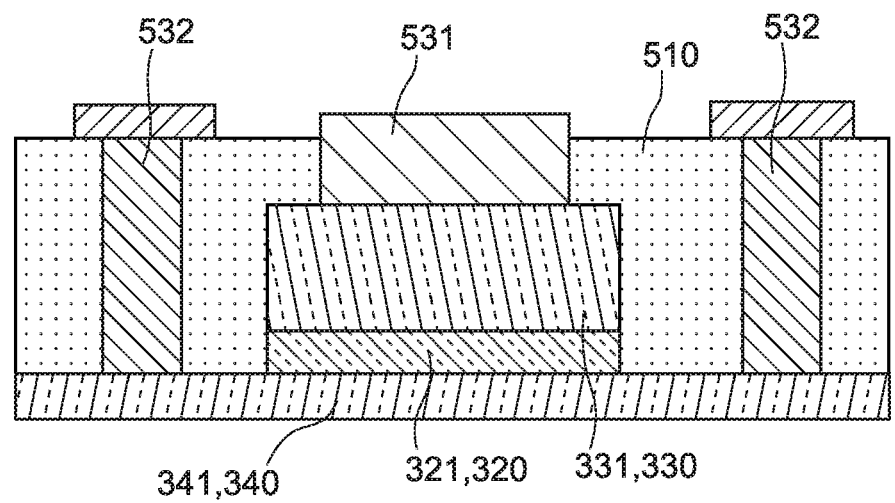

FIGS. 1G and 1H are thus a top view and a lateral sectional view along the FF axis, more precisely illustrating the layout of first and third semiconducting zones 341, 331 and the gain medium 321 so as to form the gain structure 310. The first semiconducting zone 341 has a first face in contact with the first dielectric layer 110 and a second face opposite the first face through which it is in contact with the gain medium 321. The gain medium zone 321 has a first face through which it is in contact with the first semiconducting zone 341 and a second face opposite the first face through which it is in contact with the third semiconducting zone 331.

The width of the first semiconducting zone 341 is more than the width of the gain medium 321 and of the third semiconducting zone 331 so as to authorise making contact using the second electrical contact 532 that is doubled, as shown in FIGS. 1G and 1H. Thus, the first semiconducting zone 341 has a first and a second metallic contact extending longitudinally in contact on its second face on each side of the gain medium 321 and the third semiconducting zone 331, these first and second contacts each being prolonged by an interconnection passing through the encapsulation layer 510 and a contact pad flush with the encapsulation layer 510. These first and second contacts, these interconnections and the contact pads form the second electrical contact 532.

The gain medium 321 and the third semiconductor 331 have exactly the same width. The second face of the first semiconducting zone is in contact with the first electrical contact 531, for example in the form of a longitudinal contact flush with the encapsulation layer 510. The longitudinal contact pad thus forms the first electrical contact 531.

As illustrated in FIG. 1B, the gain structure 310 is arranged to be in contact with the first face of the first dielectric layer 110 such that the gain structure 310 has a central portion facing the space 413. With such a configuration:
the central portion of the gain structure 310 and the space 413 and the third waveguide section 213 forms a hybrid laser waveguide,
the second waveguide section 212, the first excess thickness 412 and the first end of the gain structure 310 form a first optical transition zone 312 of the optical mode between the optical hybrid waveguide 313 and the first waveguide section 211, the fourth waveguide section 214, the second excess thickness 414 and the second end of the gain structure 312 form a second optical transition zone 314 of the optical mode between the optical hybrid waveguide 313 and the fifth waveguide section 215.

Thus, except for these first and second ends, the gain structure 310 is facing the third waveguide section 213 and the space 413. With such a layout, the gain medium is optically coupled to the optical feedback structure 220 to form an oscillating cavity comprising the gain medium 321.

As illustrated on FIGS. 1B and 1H, the gain structure 310 is buried in the encapsulation layer 510 with contact pads of the first and the second flush electrical contacts 531, 532.

Thus, the gain structure 310, the first to fifth sections 211, 212, 213, 214, 215, with the optical feedback structure 220 accommodated in them, the space 413 and the first and second excess thicknesses 411, 412 together form the laser 300.

FIGS. 2A to 2G illustrate the principal fabrication steps in a method of fabricating a photonic device 1 according to the invention. Like all methods described in this document, such a fabrication method is particularly suitable for implementing the steps in the invention in parallel, for the formation of a plurality of devices. With this type of implementation in parallel, such a method of fabricating photonic devices is said to be collective.

Figure 2A:
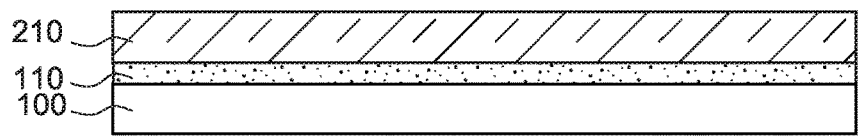
FIGS. 2A to 2G are diagrammatic and sectional views along the EE axis as illustrated on FIG. 1A, illustrating the main steps in a method of fabricating the photonic device illustrated on FIG. 1, FIGS. 3A and 3B illustrate the detailed shape of the excess thickness and the waveguide section respectively of the optical device illustrated on FIGS. 1A to 1H and an example of another possible shape of an excess thickness and a guide section to form an optical transition zone as a variant to the shape of the first transition zone, respectively.
Figure 2B:
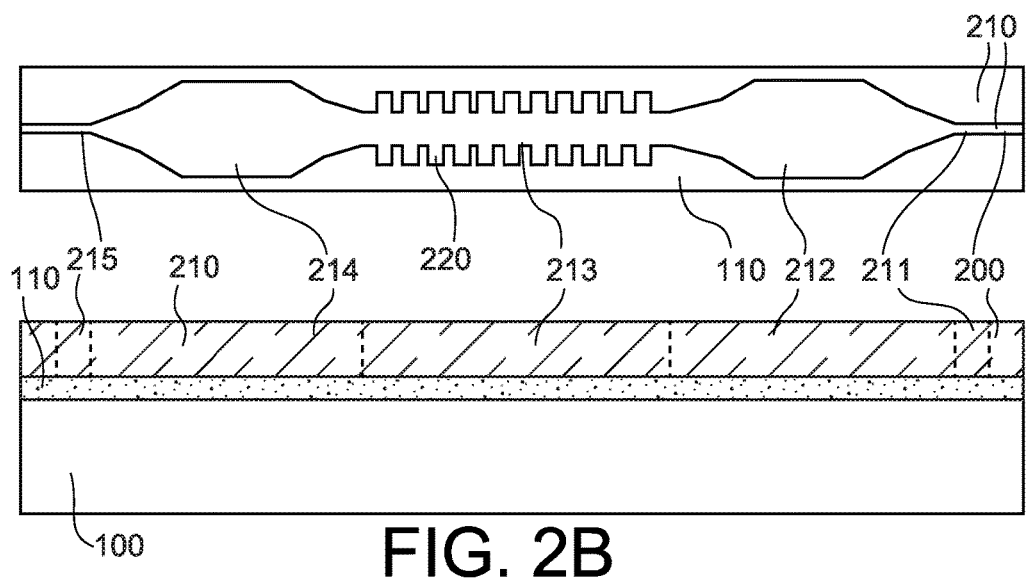
Figure 2C:
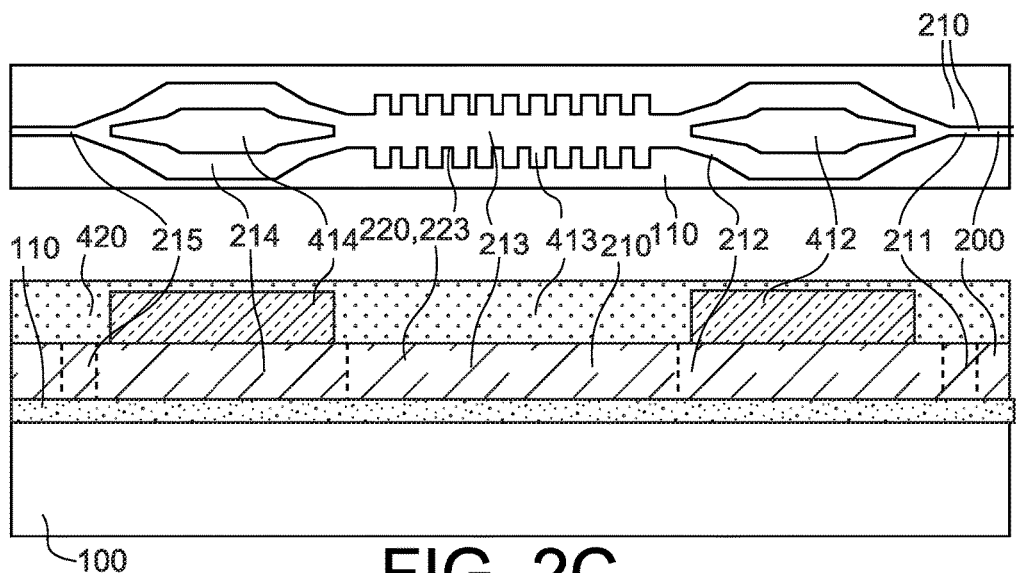
Figure 2D:
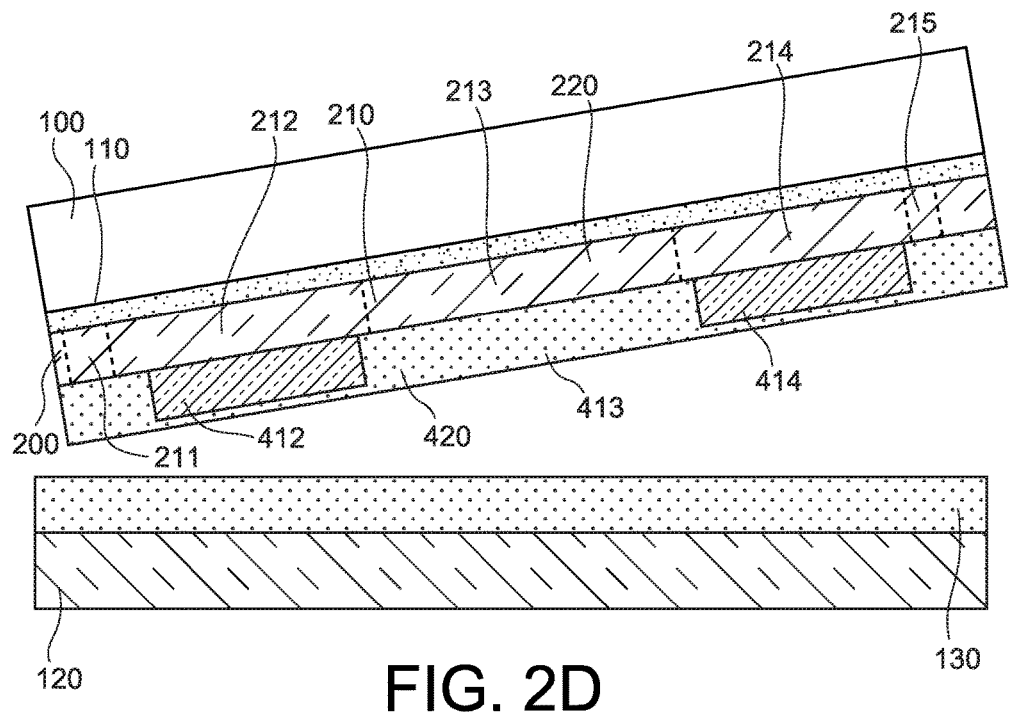
Figure 2E:
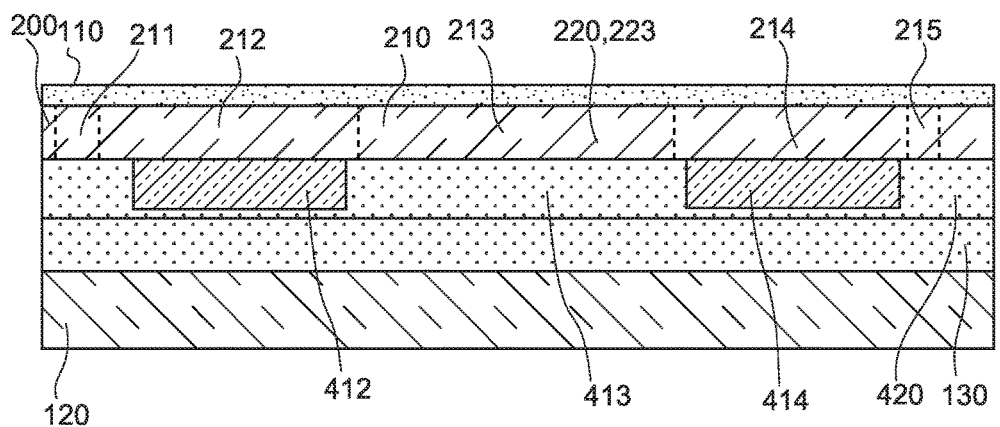
Figure 2F:
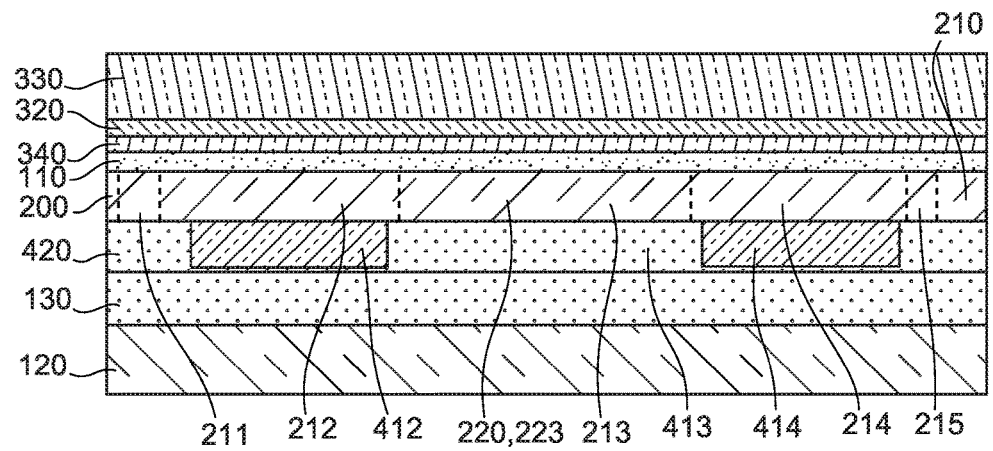
Figure 2G:
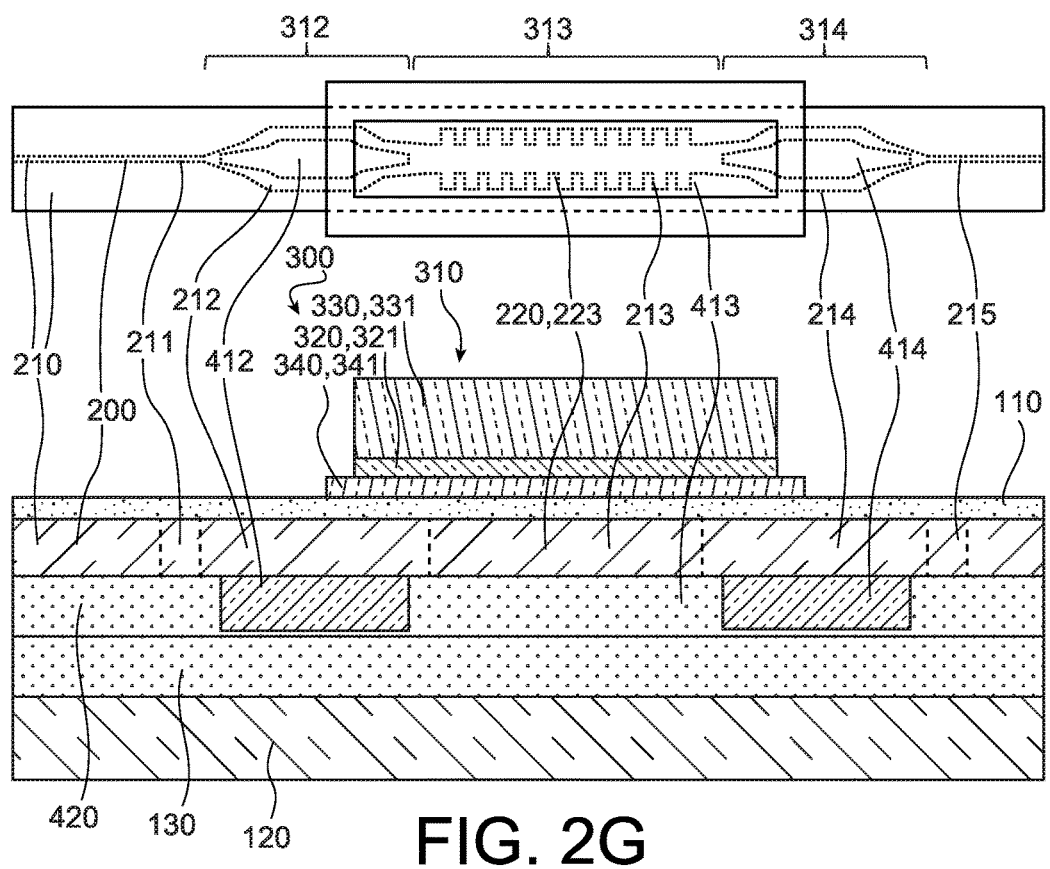

Such a method comprises the following steps:
supply the substrate 100 associated with the first silicon layer 210 on a first dielectric layer 110, as illustrated on FIG. 2A,
pattern the first silicon layer 210 to form the waveguide 200 and the first to fifth waveguide sections 211, 212, 213, 214, 215 distinct from the waveguide 200, the first to fifth waveguide sections 211, 212, 213, 214, 215 succeeding each other and being optically connected to the waveguide 200 through at least either the first or the fifth waveguide section 211, 215, the third waveguide section accommodating the distributed Bragg grating 223 forming the optical feedback structure 220 and obtained by patterning lateral corrugations of the waveguide section 213, as illustrated on FIG. 2B,
formation of the first and second excess thicknesses 412, 414 of silicon separated from each other by a space 413, the first and second excess thicknesses 412, 414 and the space facing the second, fourth and third waveguide sections 212, 214, 213 respectively,
burial of at least the first and second excess thicknesses 412, 414 of silicon by at least one dielectric material and planarisation of said dielectric material to form the intermediate layer 420, an assembly composed of the substrate 100/first dielectric layer 110/first silicon layer 210/intermediate layer 420 thus being formed, as illustrated on FIG. 2C,
supply a support 120 comprising a second dielectric layer 130,
assemble the assembly composed of the substrate 100/first dielectric layer 110/first silicon layer 210/intermediate layer 420 on the support 120 in contact with the second dielectric layer 130, the assembly being made by bonding the intermediate layer on the dielectric layer 130, as illustrated on FIG. 2D,
eliminate the substrate 120, as illustrated on FIG. 2E.
form the first, second and third semiconducting layers 340, 320, 340, as illustrated on FIG. 2F,
partially etch the first, second and third semiconducting layers 340, 320, 340 so as to form the gain structure 310 in contact with the first dielectric layer 110, and comprising the second semiconducting layer 320 as the gain medium 321 and being formed with a central portion facing the space 413 and a first and a second end facing a part of the first and the second excess thicknesses 411, 412, thus the central portion of the gain structure 310 with the space 413 and the third waveguide section 213 forms a hybrid laser waveguide, the second and fourth waveguide sections 212, 214, the first and second excess thicknesses 412, 414 of silicon and the first and second ends of the active structure 310 forming a first and a second optical transition zone 312, 314 of the optical mode between the hybrid laser waveguide 313 and the first and fifth sections respectively of the waveguide 211, 215, the photonic device thus being formed as illustrated on FIG. 2G.

In such a fabrication method, the step to form the first and the second excess thicknesses 412, 414 may be implemented in different ways.

Thus, according to a first possibility, the first and the second excess thicknesses 412, 414 may be formed by selective deposition of silicon. A step to form the first and the second excess thicknesses 412, 414 according to this possibility includes the following sub-step:
selective deposition of silicon to form the first and the second excess thickness 412, 414.

This silicon deposition sub-step may be an epitaxial deposition step such as a vapour phase deposition or molecular jet epitaxy deposition, so as to provide a first and a second excess thickness 412, 414 formed from crystalline silicon.

It will be noted that the selective deposition of silicon to form the first and the second excess thicknesses 412, 414 usually requires a prior step to form a mask protecting the parts of the first silicon layer 210 that are not to be covered, this mask preferably being made from the dielectric material of the intermediate layer 420 and a step to deposit silicon on the unprotected parts of the first silicon layer.

Thus according to this possibility and in the case in which the mask is made in the dielectric material of the intermediate layer, the step to form the first and the second excess thicknesses 412, 414 and the burial step are concomitant and include the following sub-steps in addition to the selective silicon deposition sub-step:
deposit a first underlayer of dielectric material,
planarise and pattern the first underlayer of dielectric material to form the mask, by releasing the zones in the first silicon layer on which the first and second excess thicknesses 412, 414 are formed,
after the selective silicon deposition sub-step, planarise the first underlayer of dielectric material and deposited silicon, while obtained an identical controlled height for the first underlayer and the first and second excess thicknesses 412, 414,
deposit a second underlayer of dielectric material to bury the first and second excess thicknesses 412, 414 and thus form the intermediate layer 420.

According to a second possibility, the first and the second excess thicknesses 412, 414 can be formed by the deposition of a second silicon layer 410 (illustrated with reference to FIGS. 5A to 5H in relation to the third embodiment of the invention) and the elimination of parts of said layer that will not contribute to the formation of the first and second excess thicknesses 412, 414, for example by etching. The step to form the first and the second excess thicknesses 412, 414 of silicon according to this second possibility thus includes the following sub-steps:

deposit the second silicon layer 410 on the first silicon layer 210, local etching of the second silicon layer 410 to form the first and second excess thicknesses 412, 414 of silicon.

Obviously in this case too, the deposition of the second silicon layer 410 can be an epitaxial deposit.

According to a third possibility, the first and second excess thicknesses 412, 414 can be formed by the transfer of a second silicon layer 410 and the elimination of parts of said layer that will not contribute to formation of the first and second excess thicknesses 412, 414, generally by etching. The step to form the first and the second excess thicknesses 412, 414 of silicon according to this third possibility thus includes the following sub-steps:

transfer the second silicon layer 410 onto the first silicon layer 210, for example by molecular bonding, local etching of the second silicon layer 410 to form the first and second excess thicknesses 412, 414 of silicon.

It will be noted that according to this third possibility, the second silicon layer 410 is generally transferred using a second substrate on which said second silicon layer 410 is placed and the step to transfer the second silicon layer 410 generally consists of a direct bonding assembly of the second substrate/second silicon layer assembly 410 onto the intermediate layer 420 and elimination of the second substrate. It will be noted that according to this third possibility, the second substrate is generally an SOI substrate, the transferred second silicon layer 410 then being the silicon on oxide layer of said substrate and elimination of the substrate consists of eliminating the substrate and its support oxide layer from the second silicon layer 410.

In the framework of such a fabrication method and according to one possibility not illustrated; it would also be possible to include a step to thin the first dielectric layer 110. Such a step to thin the first dielectric layer 110 could be a chemical etching step, a dry etching step or a mechanical-chemical polishing step, or a combination of these steps, in order to maintain optical control and minimum dispersion of the thickness of the first dielectric layer 110.

In the framework of such a fabrication method and according to one possibility not illustrated, it could also be envisaged to include a step in which the first dielectric layer 110 is completely eliminated by dry etching and a step in which a first alternative dielectric layer 110 is formed, followed by a step to planarise this first alternative dielectric layer 110.

Figure 3A:
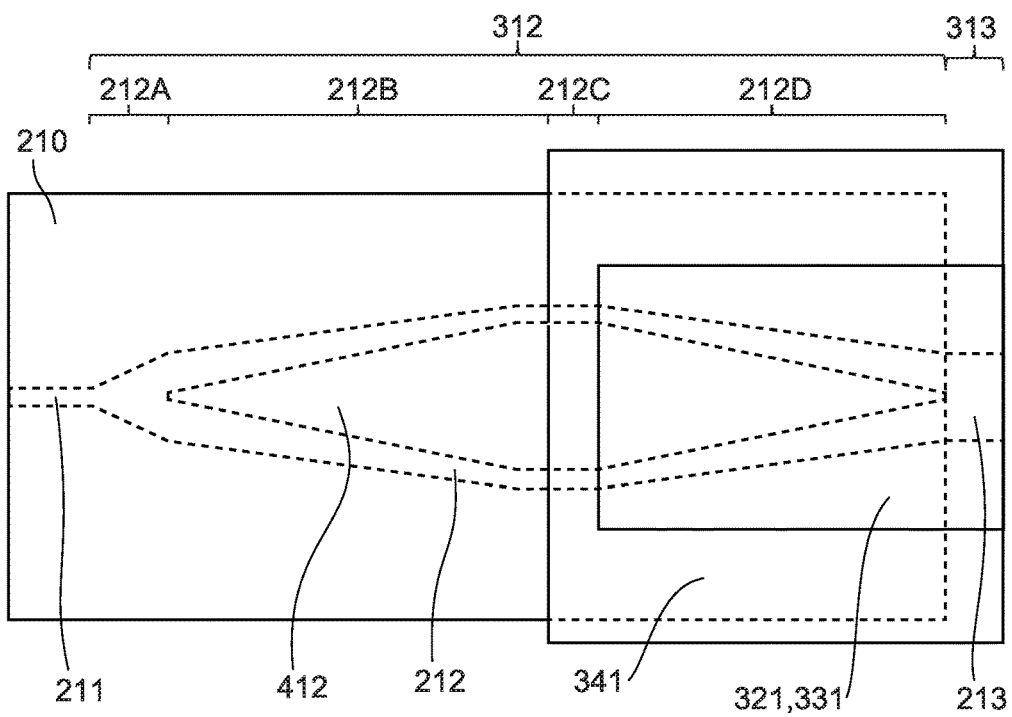
Figure 3B:
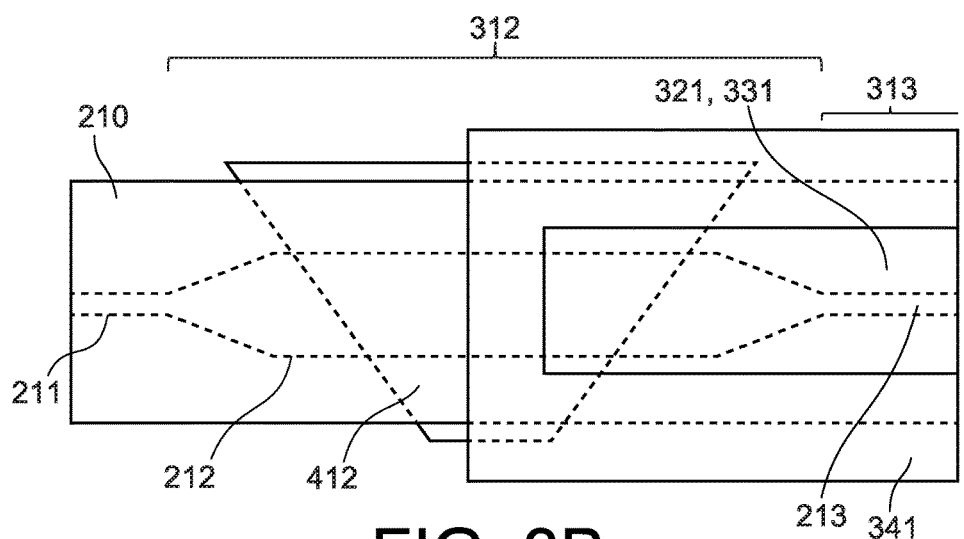

FIGS. 3A and 3B illustrate an example of the design of an optical transition zone 312 according to the practical application of this first embodiment and an example of an alternative form of such an optical transition zone 312 allowing an adiabatic transition between the hybrid layer waveguide 313 and the first optical waveguide section 211.

FIG. 3A thus illustrates the detailed shape of an optical transition zone 312 according to the practical application of the first embodiment of the invention.

In this example, the waveguide 200 and the first waveguide section 211 comprise a base for which the lateral section is 10 μm wide while the width of the lateral section of the edge is 400 nm.

The size of the base of the second waveguide section 212 is the same as the size of the waveguide 200 and the first section of the waveguide, in other words the width of its lateral section is 10 μm.

The second waveguide section 212 comprises the following at its edge and along a direction from the first waveguide section 211 to the third waveguide section 213:

a first tapered and/or trapezoidal portion 212A, in which the width of the lateral section of the edge increases from a value identical to the width of the edge of the first waveguide section 211, in other words 400 nm, to reach a value of 1 μm, a second tapered and/or trapezoidal portion 212B, in which the width of the lateral section of the edge increases from a value of 1 μm, to reach a value of 3 μm, a third constant portion 212C in which the width of the lateral section of the edge is kept constant at a value equal to 3 μm, a fourth tapered and/or trapezoidal portion 212D, in which the width of the lateral section of the edge decreases from a value identical to the width of the constant third portion, in other words a width of 3 μm, to reach the value of the width of the lateral section of the third waveguide section, in other words 0.8 μm.

According to the same example size, the first excess thickness 412 faces the second waveguide section 212 only at the second, third and fourth portions 212B, 212C, 212D of the second waveguide section 212. The first excess thickness thus comprises the following along a direction from the first waveguide section 211 to the third waveguide section 213:

a first tapered and/or trapezoidal portion facing the second portion 212B of the second waveguide section 212, the first portion of the first excess thickness having a lateral section that increases from a width of 120 nm to reach a width of 2.6 μm, a second constant portion facing the third constant portion of the second waveguide section 212, the second constant portion having a constant width of 2.6 μm, a third tapered and/or trapezoidal portion facing the fourth portion 212D of the second waveguide section 212, the third portion of the first excess thickness having a lateral section that decreases from a width of 2.6 μm to reach a width of 120 nm, According to this practical application of the first embodiment of the invention, the gain structure has the following shape:

the first end of the first semiconducting zone 341 is located facing the third constant portion 212C of the second waveguide section 212, the first semiconducting zone 341 having a lateral section with constant width equal to 70 μm, this width being identical to the lateral section of the first semiconducting zone 341 in the hybrid waveguide 313, the first ends of the gain medium 321 and the third semiconducting zone 331 are facing the third portion 212C of the second waveguide section 212 close to the fourth portion 212D, the width of the lateral section of the gain medium 321 and the third semiconducting zone 331 being constant and equal to 5 μm, this width being identical to the width of their lateral section in the hybrid waveguide 313.

FIG. 3B illustrates a close-up view of a first optical transition zone 312 with an alternative configuration to that described above. In this alternative configuration, the first excess thickness 412 is in the form of an isosceles trapezoid with its bases extending parallel to the direction of propagation of light, while the second waveguide section 212 has a tapered shape similar to that described in the framework of the first embodiment.

As illustrated on FIG. 3B, the second waveguide section 212 comprises the following at its edge:
- an increasing cross-section along a first part of its length,
- a constant cross-section along a second part of its length, that represents the majority of the length of the second waveguide section,
- a reducing cross-section along a last part of its length, As illustrated in FIG. 3B, the first excess thickness 412 comprises an isosceles trapezoidal shape with a first "long" base with a length longer than the length of the second part of the second section 212, and a "short" base with a length shorter than the length of the second part of the second section 212. The width of the first excess thickness 412 is more than the width of the base of the first section and is less than the width of the gain structure 310, and particularly the third semiconducting zone 331 of the gain structure 310.

Obviously, and in exactly the same way as for the first excess thickness 412 described for the first embodiment, the thickness of the first excess thickness 412 is chosen such that, with the second waveguide section 212, there can be an adiabatic transition between the hybrid laser waveguide 313 and the first waveguide section 211.

The configuration of the gain structure 310 is practically the same as that described with reference to FIG. 3A.

These two configurations of the first and second excess thicknesses 412, 414 and the first and second portions 211, 212 described in the framework of this first embodiment are given as configuration examples enabling optimised coupling between the hybrid waveguide 313 and the first waveguide section 211 and are in no way limitative.

FIGS. 4A to 4F illustrate a photonic device 1 according to a second embodiment in which the optical feedback structure 220 is provided by a distributed Bragg grating 223 of the type with "vertical corrugations" partially etched in the thickness of the first silicon layer 210 at the third waveguide section 213. The only difference between a photonic device 1 according to this second embodiment and the photonic device 1 according to the first embodiment is the optical feedback structure 220.

Thus, in this second embodiment, the optical feedback structure 220 is provided by a distributed Bragg grating of the type with "vertical corrugations" partially etched in the first silicon layer 210, in other words the periodic variation of the optical index of the Bragg grating is provided by a periodic variation in the thickness of the third waveguide section 213.

Figure 4A:
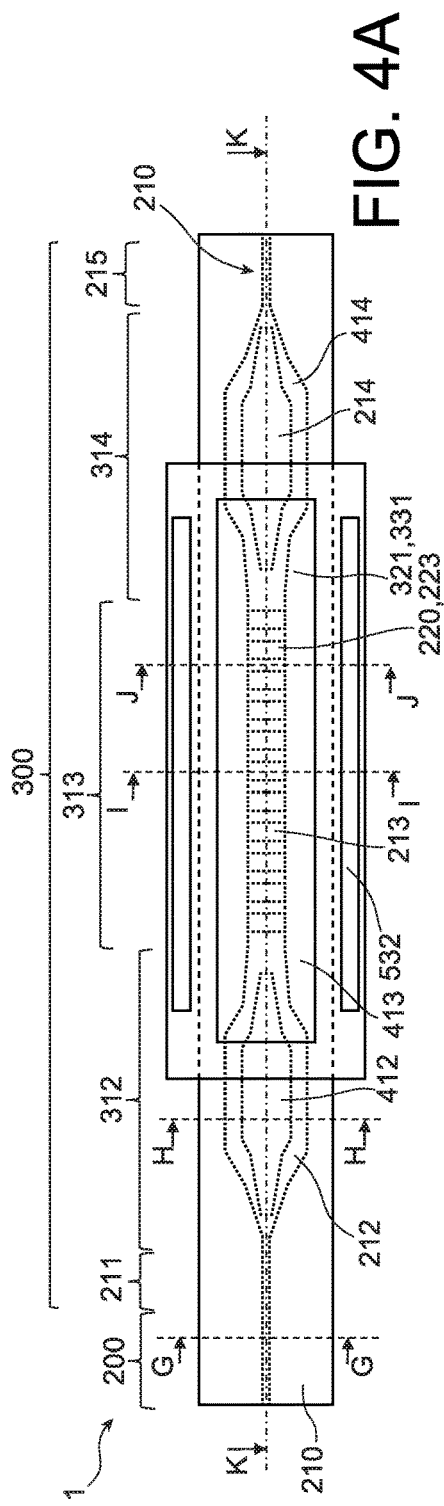
FIGS. 4A to 4F illustrate a top view, a sectional view along the KK axis, both diagrammatically representing a photonic device according to a second embodiment of the invention comprising a distributed Bragg grating under the gain structure, the Bragg grating being of the "vertical corrugations" type partially etched in the first silicon layer as a feedback structure, and four diagrammatic sectional views along the GG, HH, II and JJ axes of this same photonic device, respectively.
Figure 4B:
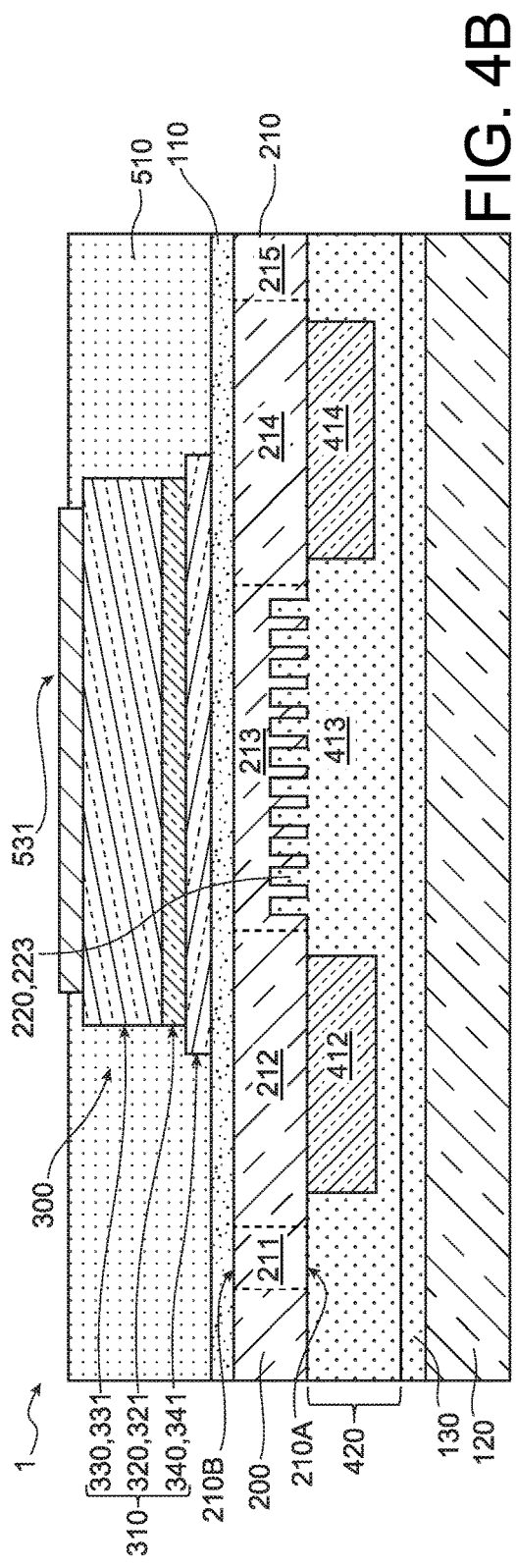
Figure 4C:
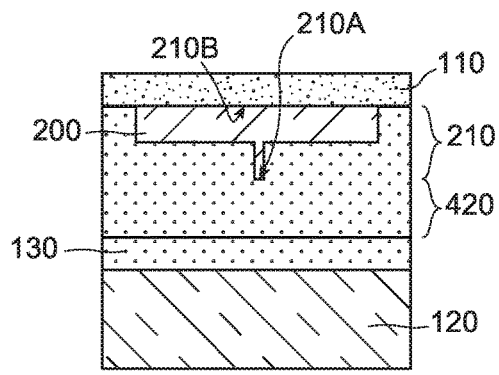
Figure 4D:
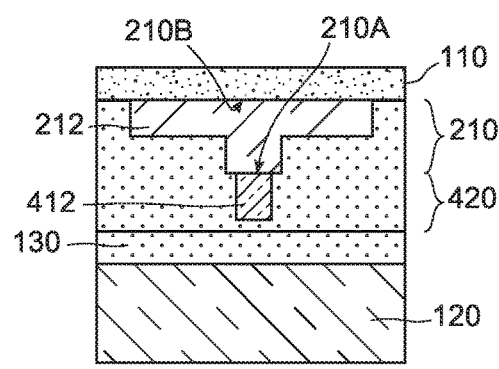
Figure 4E:
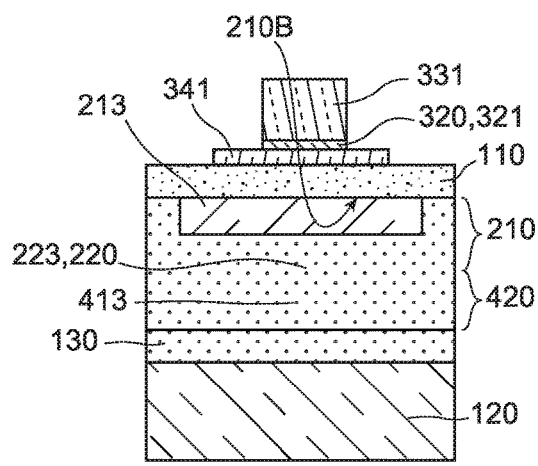
Figure 4F:
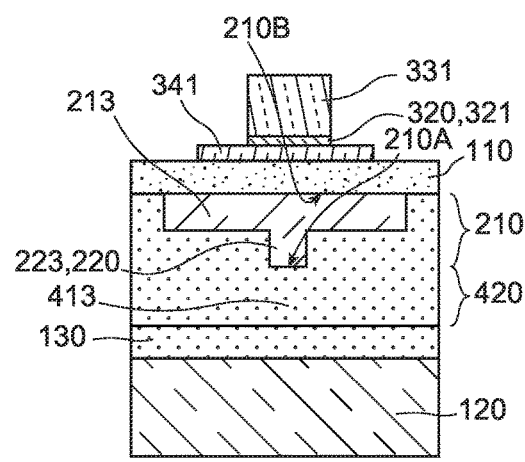

In the practical application of the invention, as illustrated in the sectional views along the II and JJ axes shown on FIGS. 4E and 4F, the variation of the thickness in the third waveguide section 213 is obtained on a second part of the thickness of the first silicon layer 210 that extends starting from the first face 210A of the first silicon layer 210 and that is typically 150 nm thick. This second part corresponds to the edge of the third waveguide section 213. The thickness of the feedback structure 220 thus varies over the entire height of the edge between a small, almost zero thickness, and a large thickness corresponding to the height of said part of the first silicon layer 210. The alternation period between the small thickness and the large thickness, according to the principle of a Bragg grating, is approximately equal to $\lambda/2n_{eff}$, where $\lambda$ is the emission wavelength of the laser 300. According to the practical application of the invention, the thickness of the first part of the first silicon layer 210 in the third waveguide section 213 is constant, and forms the base for the third waveguide section 213.

The method of fabrication of a photonic device 1 according to this second embodiment is different from the method of fabrication of a photonic device 1 according to the first embodiment in that during the patterning step of the first silicon layer 210, the optical feedback structure 220 formed is a Bragg grating with "vertical corrugations" partially etched in the thickness of the first silicon layer 210.

FIGS. 5A to 5G are longitudinal views illustrating the main steps in the fabrication of a third embodiment of a photonic device 1 in which the optical feedback structure 220 is a Bragg grating with "vertical corrugations" oriented in the direction of the gain structure 310 and partially etched in the thickness of the first silicon layer 210 comprising the first face 210A of the first silicon layer 210. The differences between a photonic device 1 according to this third embodiment and a photonic device 1 according to the second embodiment, apart from the orientation of the optical feedback structure 220, are that there is a third dielectric layer 401 between the first silicon layer 210 and the first and second excess thicknesses 412, 414, that the pattern of the first silicon layer 210 is not filled with a dielectric material, and that the pattern of the first silicon layer 210 is also transferred into the first dielectric layer 110.

Figure 5A:
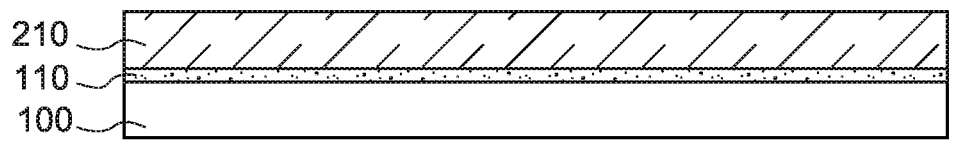
FIGS. 5A to 5H illustrate the main steps in the fabrication of a photonic device according to a third embodiment of the invention in which a "vertical corrugations" type of Bragg grating is provided, partially etched in the first silicon layer as a feedback structure and for which the corrugations are facing the gain structure.
Figure 5B:
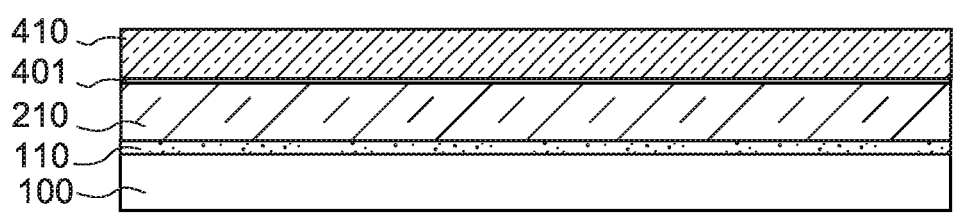
Figure 5C:
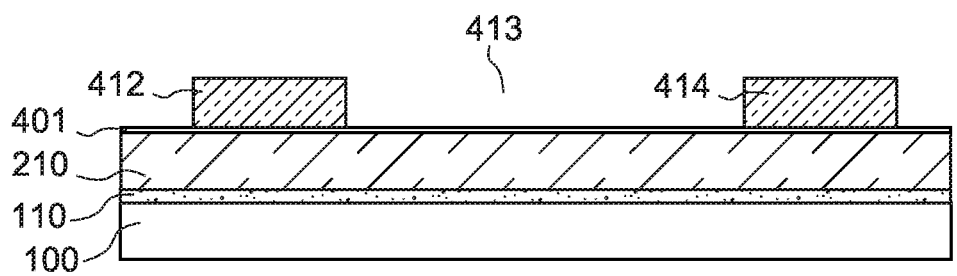
Figure 5D:
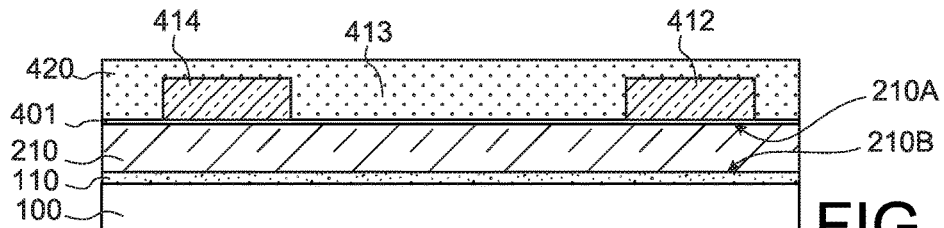
Figure 5E:
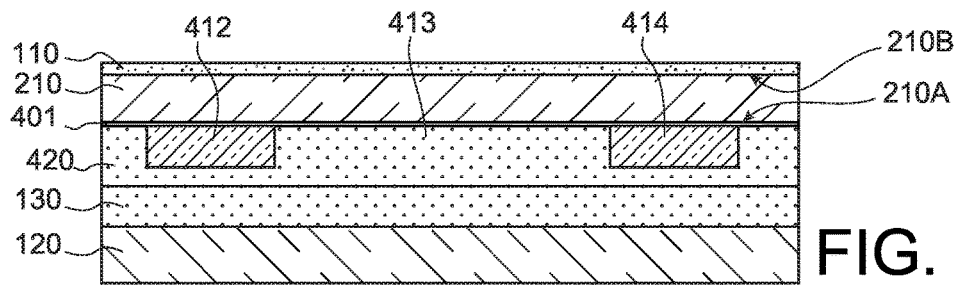
Figure 5F:
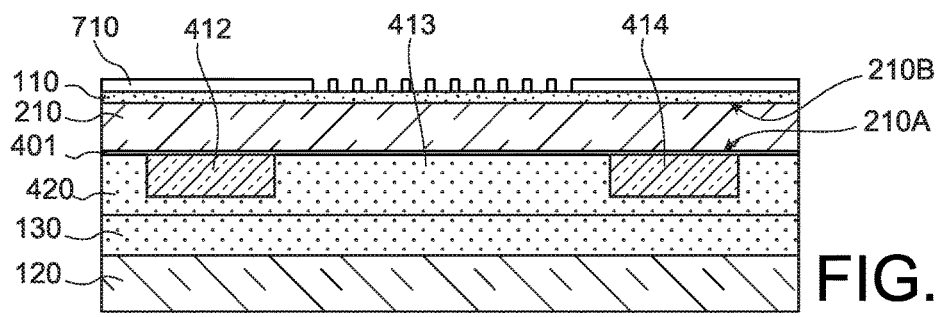
Figure 5G:
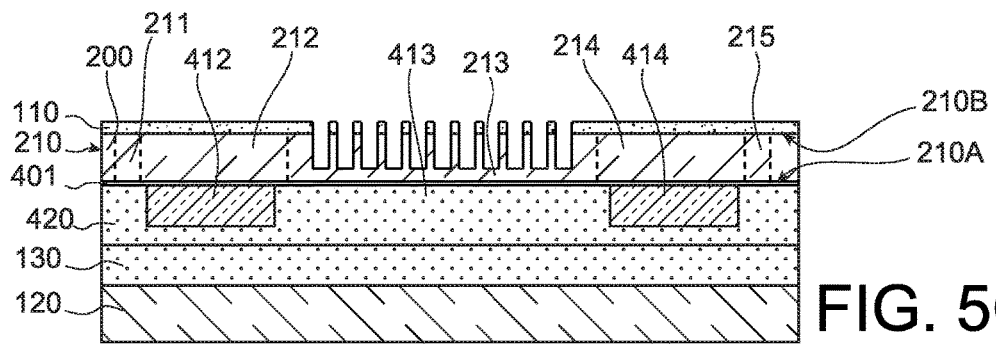
Figure 5H:
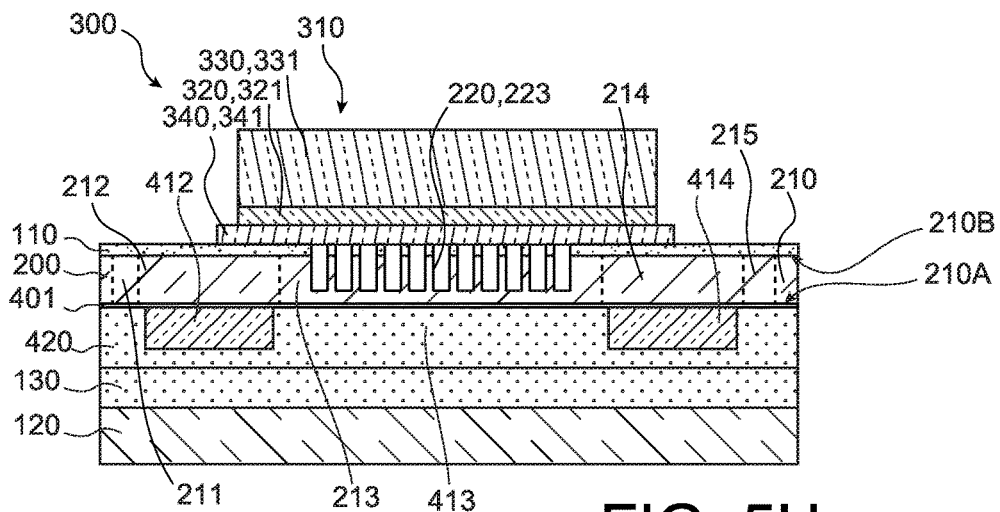

A fabrication method according to this third embodiment comprises the following steps:
- supply the substrate 100 associated with the first silicon layer 210 on the first dielectric layer 110, as illustrated on FIG. 5A,
- form a third dielectric layer 401 on the first face of the first silicon layer 210,
- form a second silicon layer 410 in contact with the third dielectric layer 401, as illustrated on FIG. 5B,
- selective etching of the second silicon layer 410 so as to form the covering first and second excess thicknesses 412, 414 of silicon facing the zones of the first silicon layer 210 that will form the second and the fourth waveguide sections 212, 214, the first and second excess thicknesses being separated by the space 413 facing a zone of the first silicon layer 210 that will form the third waveguide section 213, as illustrated on FIG. 5C,
- burial of the first and second excess thicknesses 412, 414 of silicon and filling of the space 413 by a dielectric material and planarisation of said dielectric material to form a plane intermediate layer 420, an assembly composed of the substrate 100/first dielectric layer/first silicon layer 210/intermediate layer thus being formed, as illustrated on FIG. 5D,
- supply a support 120 comprising a second dielectric layer 130,
- assemble the substrate 100/first dielectric layer 110/first silicon layer 210/intermediate layer 420 assembly on the support 120, the assembly being made by bonding the intermediate layer on the second dielectric layer 130 of the support 120,
- eliminate the substrate 120, as illustrated on FIG. 5E.
- deposit a hard mask 710, for example made of silicon nitride SiN, on the first dielectric layer 110 as illustrated on FIG. 5F,
- pattern the first silicon layer 210 and the first dielectric layer 110 through the hard mask 710 so as to form the waveguide 200 and the first to fifth waveguide sections 211, 212, 213, 214, 215 distinct from the waveguide 210, the first to the fifth waveguide sections 211, 212, 213, 214, 215 succeeding each other and being optically connected to the waveguide 200 through at least either the first or the fifth waveguide section 211, 215, the third waveguide section accommodating the optical feedback structure 220, the second, fourth and third waveguide sections 212, 214, 213 facing the first and second excess thicknesses 414, 414 and the space 413 respectively, eliminate the hard mask 710 so as to release the first dielectric layer 110, as illustrated on FIG. 5G, form the gain structure 310 in contact with the first dielectric layer 110, the gain structure 310 comprising at least the gain medium 321 capable of emitting light, the gain structure 310 having a central portion facing the space 413 and a first and a second end facing the first and the second excess thicknesses 412, 414, thus the central portion of the gain structure 310 with the space 413 and the third waveguide section 213 forms a hybrid laser waveguide, the second and the fourth waveguide sections 212, 214, the first and second excess thicknesses 412, 414 of silicon and the first and second ends of the gain structure 310 forming a first and a second optical transition zone 312, 314 of the optical mode between the hybrid laser waveguide 313 and the first and fifth waveguide sections 211, 21 respectively, as illustrated on FIG. 5H.

It will be realised that although this method includes a step to form a third dielectric layer 401, this step is optional. Thus, if such a step is not actually implemented, the second silicon layer 410 is then formed in contact with the first face 210A of the first silicon layer 210 during the step to form the second silicon layer 410. Such an optional step to form a third dielectric layer 401 is compatible with the principal embodiments of the invention.

Figure 6:
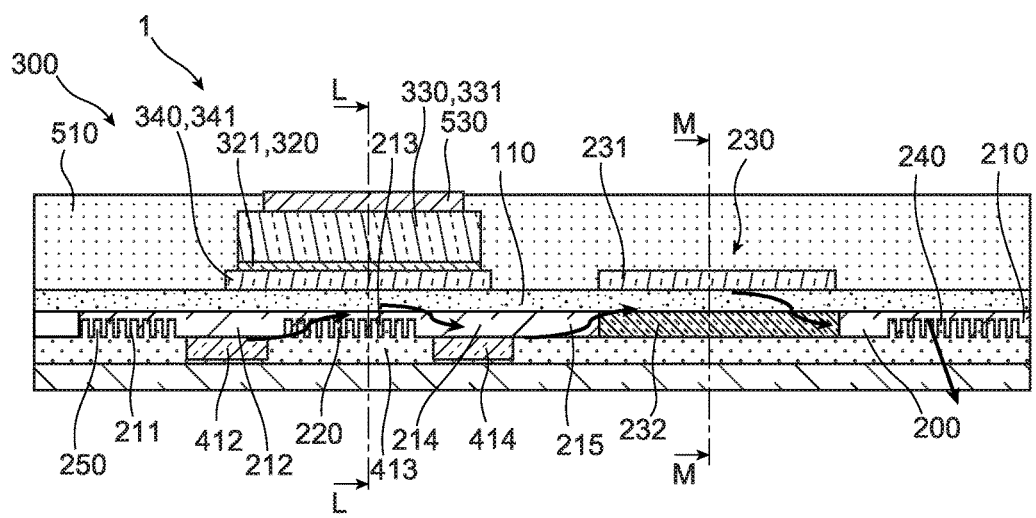
FIG. 6 illustrates a diagrammatic sectional view of a photonic device in operation according to a fourth embodiment of the invention in which a Bragg grating is provided of the type with a partially etched "vertical corrugations" grating as the feedback structure, the photonic device comprising a capacitive hybrid modulator and a surface coupling grating partially etched in the first silicon layer.

FIG. 6 illustrates a photonic device 1 according to a fourth functional embodiment that comprises a capacitive type of hybrid optical modulator 230. The difference between a photonic device 1 according to this fourth embodiment and a photonic device 1 according to the third embodiment is that, in addition to the Bragg grating with "vertical corrugations" partially etched in the first silicon layer accommodated in the third waveguide section; the optical feedback structure 220 comprises an almost total reflector 250 in the form of a Bragg grating accommodated in the first waveguide section 211, and that the waveguide 210 accommodates a capacitive type optical modulator 230 and a coupling network 240 partially etched in the first silicon layer 210.

Thus, FIG. 6 shows that the first silicon zone also comprises a doped silicon zone 232, related to a fourth semiconducting zone 231, and a coupling network 240 to extract radiation at the output from the photonic device 1. The coupling grating is a grating with "vertical and lateral corrugations".

The photonic device 1 also comprises the fourth semiconducting zone 231 that is formed from the same material 231 as the first semiconducting zone 341, and is facing the doped zone 232. The fourth semiconducting zone 231 is in contact with the second face of the first dielectric layer 110. As a result, the assembly composed of the fourth semiconducting zone 231, the doped silicon zone 232 and the part of the dielectric layer 110 that separates them forms the capacitive type hybrid optical modulator 230.

The first waveguide section 211 also accommodates a Bragg grating forming an almost total reflector 250 in order to optimise the selectivity of the oscillating cavity formed by the optical feedback structure 220.

The differences between the method of fabrication of a photonic device 1 according to this fourth embodiment and a fabrication method according to the second embodiment are:

when creating the pattern in the first silicon layer 210, the coupling grating 240 accommodated in the waveguide 200 and a Bragg grating are also formed, forming the almost total reflector 250, accommodated in the first waveguide section 211, a step is included to locally dope the first silicon layer 210 to form the doped silicon layer 210 with the opposite type of conductivity to the conductivity of the fourth semiconducting zone 231, and during formation of the gain structure 310, the fourth semiconducting zone 231 is also formed facing the doped zone 232 so as to form the capacitive modulator 230.

Figure 7A:
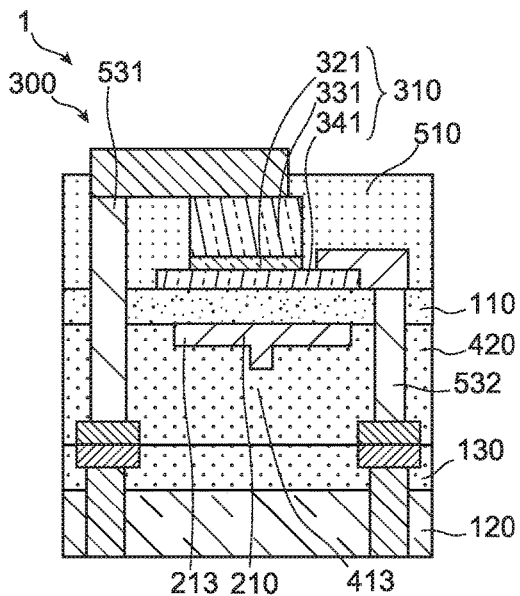
FIGS. 7A and 7B illustrate a close up sectional view along the LL and MM axes of an example of electrical contacts for the gain structure and the capacitive modulator respectively of the photonic device illustrated on FIG. 6, FIGS. 8A and 8B illustrate a close up sectional view along the LL and MM axes of another example of electrical contacts for the gain structure and the capacitive modulator respectively for the photonic device illustrated on FIG. 6.
Figure 7B:
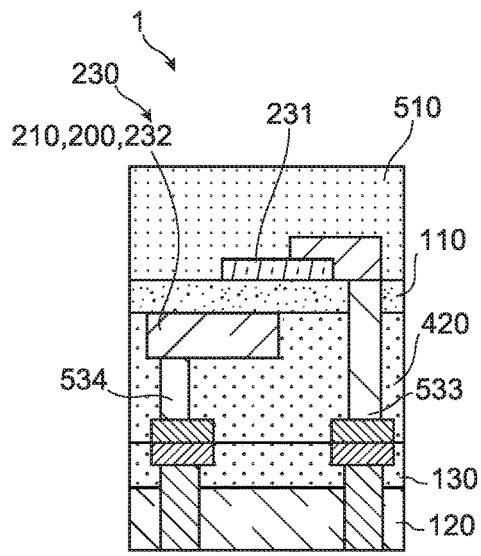

FIGS. 7A and 7B diagrammatically illustrate two sectional views along the LL and MM axes of a device according to this fourth embodiment in which an example layout of first to fourth electrical contacts 531, 532, 533, 534 has been added on the side of the substrate 120 in the framework of a photonic device according to this fourth embodiment. It will be noted that FIGS. 7A and 7B also illustrate a layer 510 that encapsulates the gain structure 310 and the fourth semiconducting zone 231 is made from a dielectric material.

FIG. 7A more precisely illustrates the first and second electrical contacts 531, 532 related to the gain structure 310. These first and second electrical contacts 531, 532 are distributed on each side of the gain structure 310 along a direction transverse to the optical feedback structure 220 to connect the first and the third semiconducting zones 331, 341 respectively. More precisely, each of the first and the second electrical contacts 531, 532 comprises a metallic contact in contact with the surface of the first and third semiconducting zones 331, 341 respectively and adapted to form a pure resistive contact with this latter semiconducting zone 331, 341. Each of the first and second electrical contacts 531, 532 also comprises a corresponding metallic via passing through the first dielectric layer 110, the intermediate layer 420 and the support 120 comprising the layer 130. Each of the metallic vias of the first and second electrical contacts 531, 532 opens up on the surface of the support 120 to authorise making contact with a control circuit of the laser 300, not illustrated.

FIG. 7B illustrates the third and fourth electrical contacts 533, 534 related to the optical modulator 230. The third electrical contact 533 connects the fourth semiconducting zone 231 of the optical modulator 230 and its configuration is similar to that of the first and the second electrical contacts 531, 532. Thus the third electrical contact 533 comprises a metallic contact in contact with the surface of the fourth semiconducting zone 231 and adapted to form a pure resistive contact with it. The third electrical contact 533 also comprises a corresponding metallic via passing through the first dielectric layer 110, the intermediate layer 420 and the support 120. The fourth electrical contact 534 comprises a metallic via in contact with the surface of the doped zone 232 and forming a pure resistive contact with it. The vias in each of the third and the fourth electrical contacts 533, 534 open up on the surface of the support 120 to authorise making contact with a control circuit of the optical modulator 230, not illustrated.

Obviously, based on the same principle and in the case in which the waveguide 200 accommodates other active optical components, for example such as a multiplexer and a demultiplexer, the photonic device 1 may comprise additional metallic vias passing through the first dielectric layer 110, the intermediate layer 420 and the support 120 and opening up on the surface of the support 120 so as to enable making contact with the control circuit of these active optical components. In the same way as for the control circuits of the laser 300 and the optical modulator 230, this control circuit may be an exclusive control circuit for said active optical components or a control circuit common with the optical modulator 230 and/or the laser 300. Thus, the control circuit of the laser 300 and the control circuit of the optical module 230 can both be formed in a single control circuit of the photonic device 1.

With such a configuration of the first to fourth electrical contacts 531, 532, 533, 534, it is possible to control the different components of the fourth embodiment of the photonic device 1, by connecting it to a control circuit on its face on the support side 120.

Figure 8A:
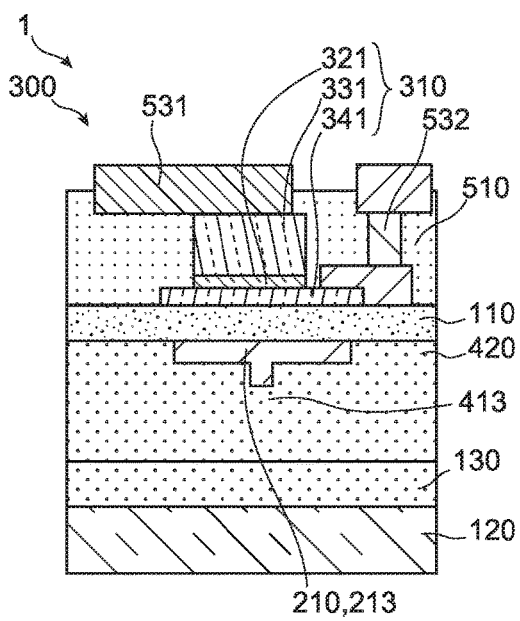
Figure 8B:
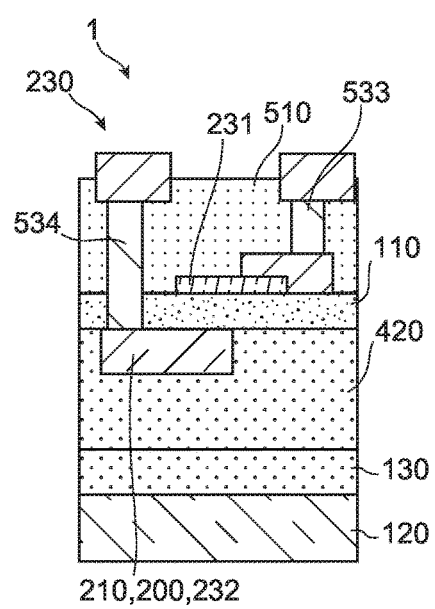

FIGS. 8A and 8B diagrammatically illustrate a second example layout of a first to a fourth electrical contact 531, 532, 533, 534 on the side of the encapsulation layer 510 in the framework of the fourth embodiment of a photonic device 1. In the same way as the possibility illustrated on FIGS. 7A and 7B, the photonic device 1 as illustrated on FIGS. 8A and 8B thus also comprises an encapsulation layer 510 that encapsulates the gain structure 310 and the fourth semiconducting zone 231.

On FIG. 8A, it can be seen that the first electrical contact 531 is composed of a lateral metallic contact in contact with the surface of the third semiconducting zone 341 and adapted to form a pure resistive contact with it. The lateral metallic contact of the first electrical contact 531 opens up in a second face of the encapsulation layer 510 that is opposite to the first dielectric layer 110. The second electrical contact 532 comprises a metallic contact to contact the first semiconducting zone 331 and adapted to form a pure resistive contact with it. The second electrical contact 532 also comprises a metallic via in contact with the metallic contact and passing through the encapsulation layer 510 opening up on the second face of the encapsulation layer 510.

FIG. 8B illustrates the third and fifth electrical contacts 533, 534 related to the optical modulator 230. The third electrical contact 253 connects the fourth semiconducting zone 231 of the optical modulator 230 and its configuration is similar to that of the second electrical contact 532. Thus the third electrical contact 533 comprises a metallic contact in contact with the surface of the fourth semiconducting zone 231 and adapted to form a pure resistive contact with it. The third electrical contact 533 also comprises a metallic via passing through the encapsulation layer 510. The metallic via of the third electrical contact 533 opens up on the second face of the encapsulation layer 510. The fourth electrical contact 254 comprises a metallic via in contact with the surface of the doped zone 232, forming a pure resistive contact with the doped zone and passing through the first dielectric layer 110 and the encapsulation layer 510, opening up in the second face of the encapsulation layer 510. The metallic vias in each of the third and fourth electrical contacts 532, 534, each opening up on the second face of the encapsulation layer 510 authorise making contact with a control circuit, not illustrated, of the photonic device 1.

Figure 9:
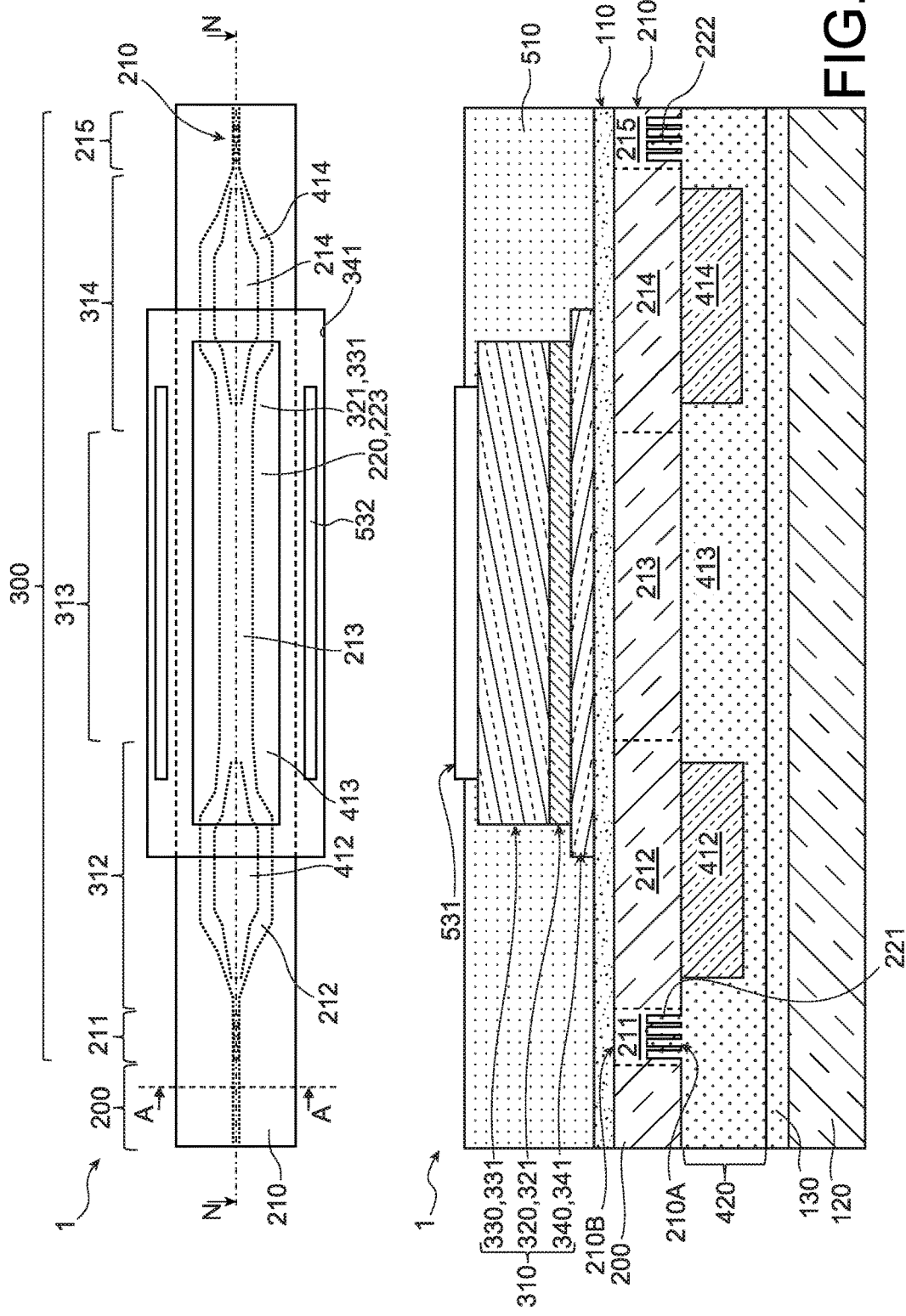
FIG. 9 illustrates a diagrammatic top view and a longitudinal sectional view along the NN axis of a photonic device according to a fifth embodiment in which there is a first and a second Bragg grating in a first and a fifth section of the waveguide to form an optical feedback structure; the first and the second Bragg gratings being supplied by vertical corrugations partially etched in the first silicon layer, FIGS. 10A and 10B each illustrate a diagrammatic close up top view and longitudinal sectional view along the OO and PP axes respectively of a transition zone, with FIG. 10A showing a photonic device according to a sixth embodiment in which a first and a second Bragg grating are provided accommodated in a second and a fourth waveguide section respectively, and FIG. 10B showing a photonic device according to a seventh embodiment in which a first and a second Bragg grating are provided accommodated in a first and a second excess thickness respectively.

FIG. 9 shows a top view and a longitudinal sectional view along the NN axis of a photonic device 1 according to a fifth embodiment in which the optical feedback structure 220 is formed from a first and a second Bragg grating 221, 222 accommodated in the first and fifth waveguide sections 211, 215 respectively. The difference between the photonic device 1 according to this fifth embodiment and a photonic device according to the first embodiment as illustrated in FIGS. 1A to 1F is that the feedback structure is composed of the first and second Bragg gratings 221, 222 accommodated in the first and fifth sections 211, 215 respectively.

As illustrated on FIG. 9, the feedback structure is formed from a first and a second Bragg grating 221, 222 of the "vertical corrugations" type partially etched within the thickness of the first silicon layer 210 accommodated in the first and fifth sections 211, 215 respectively of the waveguide. The first and the second Bragg gratings 221, 222 are of the same type as the optical feedback structure 220 of the photonic device 1 according to the fourth embodiment illustrated in FIG. 6. The first and second Bragg gratings are separated from each other by an appropriate distance to form an oscillating cavity comprising the gain medium 321. In this way, the laser 300 is a laser with a cavity delimited at its two ends by two distributed Bragg gratings, better known as "distributed Bragg reflector" (DBR) laser. In such a configuration, the second and fourth waveguide sections 212, 214 are arranged inside the oscillating cavity delimited by the first and second Bragg gratings 221, 222.

FIGS. 10A and 10B illustrate close-up views of the first and second waveguide sections 211, 212 of a photonic device 1 according to sixth and seventh embodiments respectively in which the first and the second Bragg gratings 221, 222 are accommodated in the second and fourth waveguide sections 212, 214 for the sixth embodiment, and in the first and second excess thickness 412, 413 for the seventh embodiment.

Thus, as shown on the top view and in the longitudinal sectional view along the OO axis in FIG. 10A, the differences between the photonic device 1 according to the sixth embodiment and a photonic device according to the fifth embodiment are that the first and second Bragg gratings 221, 222 are formed in the second and fourth waveguide sections 212, 214 respectively, and the first and second Bragg gratings are Bragg gratings with "lateral corrugation" partially etched in the thickness of the first silicon layer 210.

As illustrated on FIG. 10A, the first and second Bragg gratings 221, 222 are accommodated in the second and fourth waveguide sections 212, 214 in a portion of these sections with a lateral section that is approximately constant in the absence of corrugations forming said Bragg grating. The first and second Bragg gratings 221, 222, according to the principle described for the first embodiment, are distributed Bragg gratings with "lateral corrugations", partially etched in the first silicon layer 210.

The differences between the fabrication method of the photonic device 1 according to this sixth embodiment and the fabrication method of the photonic device 1 according to the first embodiment are that in the sixth embodiment, during the patterning step of the first silicon layer 210, a pattern is formed in the first silicon layer so as to form the first and second Bragg gratings 221, 222 accommodated in the second and fourth waveguide sections 212, 214 respectively, and that no Bragg grating is formed in the third waveguide section 213.

The differences between the optical device 1 according to the seventh embodiment illustrated in the top view and the longitudinal sectional view along the PP axis shown on FIG. 10B, and the fabrication method of a photonic device 1 according to the fifth embodiment are that in the seventh embodiment, the first and second Bragg gratings 221, 222 are formed in the first and second excess thicknesses 412, 414 respectively and the first and second Bragg gratings 221, 222 are Bragg gratings with "vertical corrugation" fully etched in the thickness of the first and second excess thicknesses 412, 414.

As illustrated on FIG. 10B and in a manner similar to the photonic device 1 according to the sixth embodiment, the first and second Bragg gratings 221, 222 are accommodated in the first and second excess thicknesses 412, 414 in a portion of these thicknesses with a lateral section that in the absence of corrugations forming said Bragg grating, is approximately constant. The first and second Bragg gratings 221, 222, according to a principle similar to that described for the second embodiment, are distributed Bragg gratings with "vertical corrugations". The first and second Bragg gratings are fully etched in said first and second excess thicknesses 412, 414.

The differences between the fabrication method for the photonic device according to this seventh embodiment and the fabrication method for the photonic device according to the sixth embodiment are that, in the seventh embodiment, no Bragg gratings are formed in the step in which the pattern is formed in the first silicon layer 210, and that in the step during which the first and the second excess thicknesses 412, 414 are formed, the first and second excess thicknesses 412, 414 accommodate the first and second Bragg gratings 221, 222 respectively.

Figure 11A:
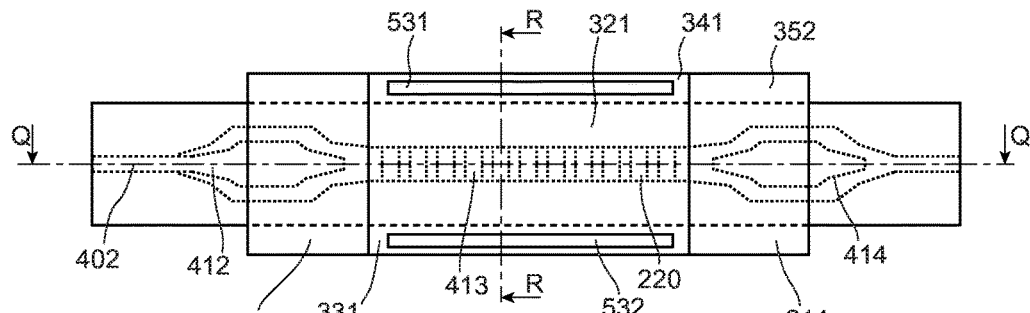
FIGS. 11A to 11C illustrate a diagrammatic top view, a longitudinal sectional view along the QQ axis and a lateral sectional view along the RR axis respectively, showing an photonic device according to an eighth embodiment of the invention in which the gain structure is a "lateral junction" type gain structure and in which the silicon waveguide is formed in the first silicon layer and also in a third excess thickness.
Figure 11B:
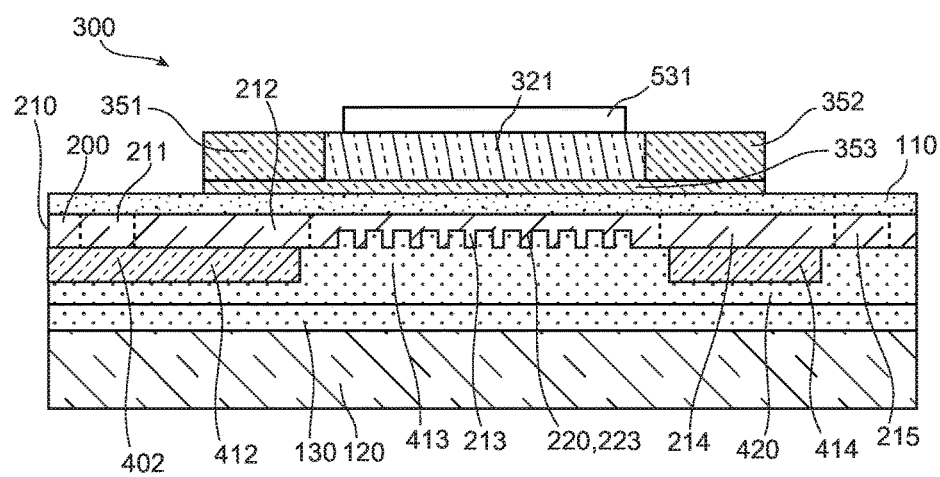
Figure 11C:
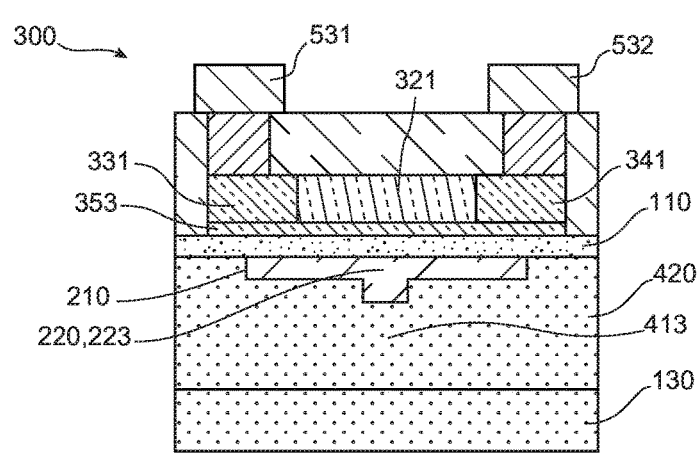

FIGS. 11A to 11C illustrate a top view and longitudinal and lateral sectional views along the QQ and RR axes of a photonic device according to an eighth embodiment in which the gain structure 310 is of the "lateral junction" type. The difference between a device according to this eighth embodiment and a photonic device 1 according to the second embodiment is that in the eighth embodiment, the gain structure 310 is a gain structure of the "lateral junction" type and that the waveguide 200 is made partly in the first silicon layer and the other part is made in at least one third excess thickness of silicon.

As illustrated in FIGS. 11A and 11B, the waveguide 200 is partly laid out in the first silicon layer 210 and at least one third excess thickness 402 of silicon that is prolonged only at the first end of the gain structure by the first excess thickness 412 of silicon. In particular, it will be noted that the third excess thickness 402 of silicon covers the first waveguide sections 211.

As illustrated in FIG. 11C, the gain structure 310 comprises the following in sequence in a cross-section of the hybrid waveguide 313 along the RR axis:
- a first semiconducting zone 341 with a first type of conductivity,
- a second semiconducting zone comprising a stack composed of a least one quantum well or quantum dot layer, and confinement layers, the second semiconducting zone forming the gain medium 321,
- a third semi-conducting zone 331 with a second type of conductivity opposite to the first type of conductivity in the semiconducting layer 341, As illustrated on FIGS. 11A to 11C, the gain structure 310 also comprises a first and a second non-intentionally doped coupling zone 351, 352 located on each side of the first, second and third semiconducting zones 341, 331 along the direction of propagation of light, and a semiconducting layer 353, also non-intentionally doped, intercalated between the first dielectric layer and the remainder of the gain structure 310. The first and the second coupling zones 351, 352 each thus correspond to one end of the gain structure 310 through which the first and second optical transition zones 312, 314 enable adiabatic transmission of the optical mode between the hybrid laser waveguide 313 and the first and fifth waveguide sections 211, 215 respectively.

The differences between the method of fabrication of a photonic device 1 according to this sixth embodiment of the invention and the fabrication method according to the second embodiment of the invention are:

the sixth embodiment also comprises a step in which at least one third excess thickness 402 of silicon is formed covering the parts of the silicon layer 210 included within or that will be included within the waveguide 200 and that will not be covered by the central zone of the gain structure 310 and by the first and second excess thicknesses 412, 414, the gain structure during the step in which the gain structure 310 is formed, is a structure with "lateral junction".

Obviously, although a configuration according to this eighth embodiment is particularly advantageous for a photonic device comprising a "lateral junction" type gain structure 310, it could also be envisaged to provide a photonic device comprising such a gain structure 310 with a configuration according to any one of the embodiments described above. Therefore with such a configuration, no third excess thickness 402 is fabricated to participate in formation of the waveguide 200. Similarly, it could perfectly well be envisaged to have a device comprising a "vertical junction" type gain structure 310 that does include such a third excess thickness 402.

It will also be noted that a variant to such an excess thickness 402, not illustrated, could be envisaged, without going outside the framework of the invention, in which the layout of the waveguide 200 is a layout in which a first part of the thickness of the waveguide 200 is in the first silicon layer 210 and a second part of the thickness of the waveguide 200 is in a fifth excess thickness formed in a material of the gain structure 310, or this layout could be combination of at least two layouts among the following:
- a layout with the waveguide 200 entirely in the first silicon layer 210,
- a layout with a first part of the thickness of the waveguide 200 in the first silicon layer 210 and a second part of the thickness of the waveguide 200 in a third excess thickness of silicon 402,
- a layout with a first part of the thickness of the waveguide 200 in the first silicon layer 210 and a second part of the thickness of the waveguide 200 in a fifth excess thickness formed in a material of the gain structure 310.

Obviously, although the shape of the gain structure in all the embodiments described above is rectangular, other shapes of the gain structure could perfectly well be envisaged without going outside the framework of the invention. Thus for example, an expert in the subject will be capable of understanding that the ends of the gain structure can also be tapered, in other words some or all of the layers forming the gain structure can become thinner starting from the central part and along a direction towards the edge along a longitudinal axis of the gain structure. For example, each of the ends of the gain structure could be trapezoidal in shape.

The invention claimed is:

1. Photonic device comprising:
   a support,
   an intermediate layer in contact with the support and comprising at least one dielectric material and a first and second excess thickness of silicon, the first and second excess thicknesses of silicon being separated from each other by a space,
   a first silicon layer in contact with the intermediate layer opposite the support, the first silicon layer comprising at least part of the thickness of a waveguide, and first to fifth waveguide sections distinct from the waveguide, the first to the fifth waveguide sections succeeding each other and being optically connected to the waveguide by at least either the first or the fifth waveguide section, the second, the fourth and the third waveguide sections facing the first and second excess thicknesses and the space, respectively, a first dielectric layer covering the first silicon layer opposite the intermediate layer, a gain structure comprising at least one gain medium capable of emitting light, the gain structure having a central portion facing the space and a first and a second end facing the first and the second excess thicknesses, thus the central portion of the gain structure with the space and the third waveguide section forms a hybrid laser waveguide, the second and the fourth waveguide sections, the first and the second excess thicknesses of silicon and the first and the second ends of the gain structure forming a first and a second optical transition zone of an optical mode between the hybrid laser waveguide and the first and fifth waveguide sections respectively, a feedback structure to form an oscillating cavity comprising at least part of the gain medium so as to form a laser optically connected to the waveguide by at least either the first or the fifth waveguide section.

2. The photonic device according to claim 1, wherein the third waveguide section accommodates a distributed reflector forming the feedback structure.

3. The photonic device according to claim 2, wherein the distributed reflector is a distributed Bragg grating selected from distributed Bragg gratings with lateral corrugations partially etched in a thickness of the first silicon layer, distributed Bragg gratings with lateral corrugations fully etched in the thickness of the first silicon layer, distributed Bragg gratings with vertical corrugations partially etched in the thickness of the first silicon layer and distributed Bragg gratings with vertical corrugations fully etched in the thickness of the first silicon layer.

4. The photonic device according to claim 3, wherein the distributed reflector is selected from distributed Bragg gratings with lateral corrugations partially etched in a thickness of the first silicon layer and distributed Bragg gratings with vertical corrugations partially etched in the thickness of the first silicon layer, and wherein the part of the thickness of the first silicon layer in which the corrugations are etched is the part of the thickness of the first silicon layer that is opposite the first dielectric layer and the gain structure.

5. The photonic device according to claim 1, wherein the first and the fifth waveguide sections accommodate a first and a second mirror respectively so as to form an oscillating cavity comprising the gain medium, the first and the second mirrors forming the feedback structure.

6. The photonic device according to claim 1, wherein the second and the fourth waveguide sections accommodate a first and a second distributed Bragg grating respectively so as to form an oscillating cavity comprising the gain medium, the first and the second distributed Bragg gratings forming the feedback structure.

7. The photonic device according to claim 1, wherein the first and the second excess thicknesses accommodate a first and a second distributed Bragg grating respectively so as to form an oscillating cavity comprising the gain medium, the first and the second distributed Bragg gratings forming the feedback structure.

8. The photonic device according to claim 1, wherein the gain structure is chosen from gain structures of the "vertical junction" type and gain structures of the "lateral junction" type.

9. The photonic device according to claim 1, wherein the layout of the waveguide is chosen from among:
a layout with the waveguide entirely in the first silicon layer,
a layout with a first part of the thickness of the waveguide in the first silicon layer and a second part of the thickness of the waveguide in a third excess thickness of silicon,
a layout with a first part of the thickness of the waveguide in the first silicon layer and a second part of the thickness of the waveguide in a fifth excess thickness formed in a material of the gain structure,
a combination of at least two of the above-mentioned layouts.

10. The photonic device according to claim 1, wherein the first waveguide accommodates at least one optical component.

11. The photonic device according to claim 10, wherein the optical component is chosen from the group comprising silicon optical modulators with a PN junction, III-V semiconductor on silicon hybrid modulators, surface coupling gratings, edge couplers, optical filters, wavelength multiplexers and demultiplexers, and photodetectors including germanium on silicon photodetectors and III-V semiconductor on silicon detectors.

12. The photonic device according to claim 1, wherein the first and second excess thicknesses of silicon are each made from a silicon selected from among a monocrystalline silicon, an amorphous silicon and a polycrystalline silicon.

13. Method of fabrication of a photonic device comprising at least one silicon waveguide and a laser comprising a gain medium capable of emitting light, the method comprising the following steps:
supply a substrate associated with a first silicon layer on a first dielectric layer,
pattern the first silicon layer to form, in the first silicon layer, at least part of the thickness of a waveguide, and first to fifth waveguide sections distinct from the waveguide, the first to the fifth waveguide sections succeeding each other and being optically connected to the waveguide by at least either the first or the fifth waveguide section,
formation of a first and a second excess thickness of silicon separated from each other by a space, the first and the second excess thicknesses and the space facing the second, fourth and third waveguide sections respectively or zones of the first silicon layer that will formed its,
burial of at least the first and second excess thicknesses of silicon by at least one dielectric material and planarisation of said dielectric material to form an intermediate layer, an assembly composed of the substrate/first dielectric layer/first silicon layer/intermediate layer thus being formed,
supply a support,
assemble the substrate/first dielectric layer/first silicon layer/intermediate layer assembly on the support, the assembly being made by bonding the intermediate layer on the support,
eliminate the substrate,
formation of a gain structure comprising at least the gain medium, the gain structure being formed in contact with the first dielectric layer and having a central portion of the gain structure facing the space and a first and a second end facing the first and the second excess thicknesses, thus the central portion of the gain structure with the space and the third waveguide section forms a hybrid laser waveguide, the second and the fourth waveguide sections, the first and the second excess thicknesses of silicon and the first and the second ends of the gain structure forming a first and a second optical transition zone of an optical mode between the hybrid laser waveguide and the first and fifth waveguide sections respectively, the photonic device thus being formed, and wherein a feedback structure is also formed to form an oscillating cavity comprising at least partly the gain medium and thus form a laser optically connected to the waveguide by at least one of the first and the fifth waveguide sections during at least one of the steps among the step to pattern the first silicon layer and the step to form the first and the second excess thicknesses of silicon.

14. The method of fabrication according to claim 13, wherein the patterning step of the first silicon layer is done prior to the step to form the first and second excess thicknesses of silicon.

15. The method of fabrication method according to claim 13, wherein the patterning step of the first silicon layer is done after the step to eliminate the substrate and in which the patterning step of the first silicon layer is a step to pattern the first silicon layer and the first dielectric layer.

16. The method of fabrication according to claim 13, wherein a step to thin the first dielectric layer is also included between the steps to eliminate the substrate and to form the gain structure.

17. The method of fabrication according to claim 13, wherein the step to form the first and the second excess thicknesses of silicon is selected from:
- selective deposition of silicon in contact with the first silicon layer to form the first and second excess thicknesses of silicon,
- deposition of a second silicon layer and local etching of the second silicon layer to form the first and second excess thicknesses of silicon,
- assembly of a second silicon layer on the first silicon layer and local etching of the second silicon layer to form the first and second excess thicknesses of silicon.

18. The method of fabrication according to claim 13, also comprising the following step:
- formation of at least one third excess thickness of silicon covering parts of the first silicon layer that are patterned or that will be patterned, the third waveguide section not having any additional excess thickness of silicon,
- and wherein at least one third excess thickness of silicon forms part of the waveguide.

* * * * *